US011520083B2

(12) United States Patent
Nakayama

(10) Patent No.: US 11,520,083 B2
(45) Date of Patent: Dec. 6, 2022

(54) MEMBER, IMAGING APPARATUS, AND METHOD FOR PRODUCING MEMBER

(71) Applicant: CANON KABUSHIKI KAISHA, Tokyo (JP)

(72) Inventor: Tomonari Nakayama, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 9 days.

(21) Appl. No.: 16/217,347

(22) Filed: Dec. 12, 2018

(65) Prior Publication Data
US 2019/0187335 A1 Jun. 20, 2019

(30) Foreign Application Priority Data

Dec. 19, 2017 (JP) .............................. JP2017-243145
Nov. 28, 2018 (JP) .............................. JP2018-222755

(51) Int. Cl.
*G02B 1/04* (2006.01)
*G02B 1/18* (2015.01)
(Continued)

(52) U.S. Cl.
CPC ............... *G02B 1/18* (2015.01); *B05D 5/00* (2013.01); *B05D 7/53* (2013.01); *C03C 17/00* (2013.01);
(Continued)

(58) Field of Classification Search
CPC . G02B 1/118; G02B 1/02; G02B 1/04; G02B 5/0242; G02B 27/0006;
(Continued)

(56) References Cited

U.S. PATENT DOCUMENTS 5,728,792 A * 3/1998 Tanaka .................... A61L 15/60
525/426
6,055,376 A * 4/2000 Ohtaka ..................... G02B 1/10
396/51
(Continued)

FOREIGN PATENT DOCUMENTS

CN 101296875 A 10/2008
JP 11-100234 A 4/1999
(Continued)

OTHER PUBLICATIONS

Translation to English of JP2015-194546 Avia espacenet. accessed Aug. 13, 2021 (Year: 2015).*
(Continued)

*Primary Examiner* — Nancy R Johnson
(74) *Attorney, Agent, or Firm* — Venable LLP

(57) ABSTRACT

Provided are a transparent member having excellent transparency and maintaining anti-fogging properties for a long period of time and a method for producing a transparent member. A transparent member includes a substrate and a stacked body having an organic layer and an inorganic porous layer stacked on the substrate in the mentioned order such that the both layers are in contact with each other, in which the organic layer includes an organic molecular chain network including an organic polymer chain and an organic crosslinking chain having 3 or more to 30 or less carbon atoms, and an acidic group aggregate, and in which the inorganic porous layer has hydrophilicity and includes silicon oxide.

17 Claims, 24 Drawing Sheets

(51) Int. Cl.
*G02B 1/02* (2006.01)
*C23C 14/24* (2006.01)
*C23C 14/18* (2006.01)
*C23C 14/10* (2006.01)
*B05D 7/00* (2006.01)
*C03C 17/00* (2006.01)
*B05D 5/00* (2006.01)
*G02B 1/118* (2015.01)
*B05D 3/02* (2006.01)
*B05D 1/00* (2006.01)

(52) U.S. Cl.
CPC .............. *C23C 14/10* (2013.01); *C23C 14/18* (2013.01); *C23C 14/24* (2013.01); *G02B 1/02* (2013.01); *G02B 1/04* (2013.01); *B05D 1/005* (2013.01); *B05D 3/0254* (2013.01); *B05D 2203/35* (2013.01); *B05D 2601/22* (2013.01); *G02B 1/118* (2013.01)

(58) Field of Classification Search
CPC . G02B 1/018; B05D 7/53; B05D 5/00; B05D 3/0254; B05D 2203/35; B05D 2601/222; B05D 1/005; B32B 3/00; B32B 3/30; B32B 9/048; B32B 9/045; B32B 27/00; B32B 27/08; B32B 27/14; B32B 27/286; B32B 27/30; B32B 27/308; B32B 2264/102; B32B 2307/728; C03C 17/00; C03C 17/42; C03C 2217/42; C03C 2217/478; C23C 14/24; C23C 14/18; C23C 14/10

See application file for complete search history.

(56) References Cited

U.S. PATENT DOCUMENTS

| | | | |
|---|---|---|---|
| 6,156,409 A * | 12/2000 | Doushita | ................ B32B 27/14 427/190 |
| 6,287,683 B1 * | 9/2001 | Itoh | ........................ C03C 17/34 428/336 |
| 7,771,832 B2 | 8/2010 | Nakayama et al. | |
| 8,034,437 B2 | 10/2011 | Nakayama et al. | |
| 8,084,082 B2 | 12/2011 | Nakayama et al. | |
| 8,163,333 B2 | 4/2012 | Nakayama et al. | |
| 8,541,049 B2 | 9/2013 | Nakayama et al. | |
| 2008/0207797 A1 * | 8/2008 | Takahashi | .......... C08G 18/6237 523/169 |
| 2009/0011244 A1 * | 1/2009 | Kishikawa | ............ C03C 17/326 428/411.1 |
| 2012/0207973 A1 | 8/2012 | Sakai et al. | |
| 2016/0061998 A1 | 3/2016 | Sakai et al. | |
| 2016/0083505 A1 * | 3/2016 | Tanaka | .................... C08L 63/00 522/111 |
| 2019/0056529 A1 * | 2/2019 | Zhu | ......................... G02B 1/11 |

FOREIGN PATENT DOCUMENTS

| | | | | |
|---|---|---|---|---|
| JP | 2001-40294 A | | 2/2001 | |
| JP | 2002-355916 A | | 12/2002 | |
| JP | 2012-185495 A | | 9/2012 | |
| JP | 2015194546 A | * | 11/2015 | ............. G02B 1/041 |

OTHER PUBLICATIONS

First Office Action in Chinese Application No. 201811553063.4 (dated Jan. 2021).
Second Office Action in Chinese Application No. 201811553063.4 (dated Sep. 2021).

* cited by examiner

MEMBER, IMAGING APPARATUS, AND METHOD FOR PRODUCING MEMBER

BACKGROUND OF THE INVENTION

Field of the Invention

The present invention relates to a transparent member having excellent anti-fogging properties and optical properties, an imaging apparatus including the transparent member, and a method for producing a transparent member.

Description of the Related Art

A transparent substrate such as a glass substrate and a plastic substrate scatters transmitted light due to fine water droplets adhering to the substrate surface when the substrate surface has a temperature not higher than the dew-point temperature, and the transparency is impaired to cause what is called a "fogging" state. To prevent fogging, various methods have been disclosed.

For example, in a method of preventing fogging, a heater or the like is provided on a substrate for heating, and the substrate surface is maintained at a dew-point temperature or higher. This technology requires a power source but has an advantage of capable of maintaining the anti-fogging properties semipermanently.

In another method, the wettability of the surface of a substrate is improved to suppress development of water droplets. Japanese Patent Application Laid-Open No. H11-100234 discloses a fogging prevention method in which the surface of a substrate is covered with an uneven film containing metal oxide particles to improve water wettability.

In another method, a hygroscopic film is provided on the surface of a substrate, and the film is allowed to absorb water to prevent water droplets from developing. For example, Japanese Patent Application Laid-Open No. 2001-40294 discloses a method in which the surface of a substrate is covered with a hygroscopic film prepared by curing a water absorbing polymer with an inorganic binder.

In addition, an anti-fogging film in which a water absorbing polymer layer is stacked on a substrate and a layer containing metal oxide particles is stacked thereon has been disclosed (Japanese Patent Application Laid-Open No. 2002-355916).

SUMMARY OF THE INVENTION

However, the method of providing a heater to make the substrate surface have a temperature not higher than the dew point has disadvantages in increasing weight and space for the heater and the power source.

By providing an uneven structure to improve the water wettability, by using a water absorbing polymer to improve the hygroscopic capacity, or by combination of them, anti-fogging properties should be improved. However, even in any case, water droplets can be simply prevented from developing before the film is saturated with water. When the anti-fogging properties are intended to be improved by increasing the film thickness or by excessively increasing the moisture absorption amount per unit volume, swelling may reduce the transparency or distort the face, and thus the anti-fogging properties have not been dramatically improved.

The present invention has been accomplished in view of the above circumstances and provides a transparent member having excellent transparency and maintaining anti-fogging properties for a long period of time, an imaging apparatus including the transparent member, and a method for producing a transparent member.

An aspect of the present invention is a transparent member including a substrate; and a stacked body having an organic layer and an inorganic porous layer stacked on the substrate in the mentioned order from the substrate side such that the both layers are in contact with each other, in which the organic layer includes an organic molecular chain network including an organic polymer chain and an organic crosslinking chain, and an acidic group aggregate, and in which the inorganic porous layer has hydrophilicity.

Another aspect of the present invention is an imaging apparatus including a housing; an optical system disposed inside the housing; and an image sensor configured to convert an image incident through the optical system into a signal, in which the optical system includes a transparent member provided at a boundary between an outside and an inside of the housing, in which the transparent member includes a substrate and a stacked body having an organic layer and an inorganic porous layer stacked on a surface of the substrate facing inside the housing in the mentioned order from the substrate side such that the both layers are in contact with each other, and in which the organic layer includes an organic molecular chain network including an organic polymer chain and an organic crosslinking chain, and an acidic group aggregate, and the inorganic porous layer has hydrophilicity.

Still another aspect of the present invention is a method for producing a transparent member including a stacked body on a substrate, and the method includes a step of forming, on a substrate, an organic layer containing an organic molecular chain network including an organic polymer chain and an organic crosslinking chain and containing an acidic group aggregate by application of a solution and thermal curing, and a step of forming, on the organic layer, a hydrophilic inorganic porous layer containing silicon oxide by application of a liquid.

According to the present invention, a transparent member having excellent transparency and anti-fogging properties can be provided.

Further features of the present invention will become apparent from the following description of exemplary embodiments with reference to the attached drawings.

DESCRIPTION OF THE EMBODIMENTS

Embodiments of the present invention will now be specifically described with reference to drawings.

[Transparent Member]

Figure 1:
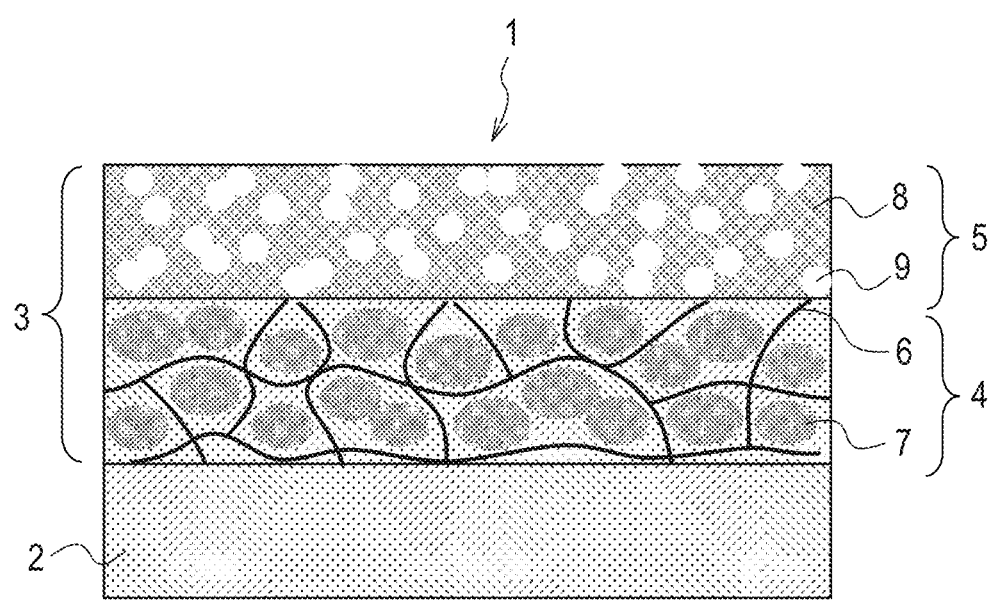
FIG. 1 is a schematic view showing an embodiment of a transparent member of the present invention.

FIG. 1 is a schematic view showing an embodiment of a transparent member pertaining to the present invention. In the present invention, a "transparent" substance means a substance having a visible light transmittance of 50% or more.

A transparent member 1 of the embodiment includes a substrate 2 and a stacked body 3 having an organic layer 4 and an inorganic porous layer 5 stacked on the substrate in this order such that the both layers are in contact with each other.

As shown in FIG. 1, the organic layer 4 contains an organic molecular chain network 6 and acidic group assemblies 7. The porous layer 5 includes a hydrophilic silicon oxide and contains a silicon oxide body 8 and pores 9. The pores 9 preferably communicate with each other.

The transparent member 1 of the present invention can continuously retain a water film on the silicon oxide porous layer 5 and thus does not cause fogging even when exposed to such an environment as to develop dew for a long period of time. Hence, the transparent member 1 of the present invention can be widely applied to windowpanes, mirrors, lenses, transparent films, and the like.

As long as the porous layer 5 retains a water film thereon, an image passed through the transparent member 1 is not distorted, and thus the transparent member is particularly preferably used for optical applications including lenses for an imaging optical system, lenses for a projection optical system, optical mirrors, optical filters, eyepieces, flat covers for outdoor cameras, and dome covers for monitoring cameras.

(Porous Layer)

The silicon oxide body 8 contained in the silicon oxide porous layer 5 includes a hydrophilic silicon oxide.

The silicon oxide porous layer 5 can trap water from the outside air and send the water to the organic layer 4 when the outside air has a high humidity, and can discharge the water absorbed by the organic layer 4 to the outside air when the outside air has a low humidity. Hence, the pores 9 preferably have an average pore diameter of 3 nm or more to 30 nm or less that is determined by pore distribution measurement in accordance with nitrogen gas adsorption method. If the average pore diameter is less than 3 nm, water is retained in such a porous layer 5, thus air or water may be prevented from moving from the porous layer 5 to the organic layer 4 through a contact surface, and sufficient anti-fogging properties may not be achieved. If the average pore diameter is more than 30 nm, such a porous layer contains pores having a pore diameter of more than 100 nm at a higher proportion to cause light scattering, and the transparency may be impaired. The pore diameter is more preferably 5 nm or more to 20 nm or less.

The volume percent of pores 9 in a silicon oxide porous layer 5 is called percentage of voids or porosity. The porosity P can be determined in accordance with Expression (1), where n is the refractive index of a silicon oxide porous layer 5, 1.46 is the refractive index of a silicon oxide body 8, and the refractive index of pores is 1.00.

$$P(\% \text{ by volume}) = (1.46-n)/0.46 \qquad (1)$$

The silicon oxide porous layer 5 preferably has a porosity P of 10% by volume or more to 70% by volume or less. If the porosity P is less than 10% by volume, air or water insufficiently moves from the porous layer 5 to the organic layer 4, and sufficient anti-fogging properties may not be achieved. If the porosity is more than 70% by volume, the hardness is reduced, and sufficient scratch resistance may not be achieved. The porosity P is more preferably 20% by volume or more to 60% by volume or less.

The surface of the silicon oxide porous layer 5 preferably has a contact angle of pure water of 3° or more to 30° or less. If the contact angle of pure water is less than 3°, trapped water is unlikely to be discharged, and the anti-fogging properties may not continue. If the contact angle of pure water is more than 30°, water droplets are likely to be formed on the surface of the silicon oxide porous layer 5, and the anti-fogging properties may be degraded. The contact angle of pure water is more preferably 5° or more to 20° or less.

The silicon oxide porous layer 5 may be a vacuum deposited layer, a wet film-formed layer of a silicon oxide precursor by a sol-gel method or the like, or a wet film-formed layer from a dispersion liquid of silicon oxide particles, and is preferably free from organic substances as much as possible. Specifically, the silicon oxide porous layer 5 contains organic substances preferably at a C/Si element ratio of 3/100 or less. If a silicon oxide porous layer 5 contains a hydrophobic organic substance at a C/Si element ratio of more than 3/100, the silicon oxide porous layer 5 has a higher surface hydrophobicity and thus cannot trap water from the outside, and water may not be supplied to the organic layer 4. If containing a hydrophilic or hygroscopic organic substance at a C/Si element ratio of more than 3/100, the silicon oxide porous layer 5 may trap water, and water may not be supplied to the organic layer 4.

To form a porous layer by a vacuum method, a phenomenon in which the pressure in vacuum deposition is increased to increase the collision probability of evaporating particles in a gas phase, and particle energy is decreased to reduce surface diffusion on a substrate can be adopted (see Japanese Patent Application Laid-Open No. 2012-185495). To form a porous layer from a wet film-formed silicon oxide layer, a method in which a silicon oxide layer including an organic substance that causes phase separation into several nanometers to several tens of nanometers of domains is formed and then the organic substance is decomposed and removed by heat and/or ultraviolet light or a method of washing out the organic substance with an organic solvent or the like can be adopted.

The organic substance for forming the porous layer is preferably polyethylene glycol, polypropylene glycol, or a random copolymer or block copolymer thereof, which enables formation of fine, uniform pores, and can be used as a mixture with a sol liquid prepared by hydrolysis of a silicon oxide precursor such as silicate esters.

To help pores 9 to connect together and to give a uniform average pore diameter and porosity, a wet film-formed layer from a dispersion liquid of silicon oxide particles is preferably used.

Figure 2:
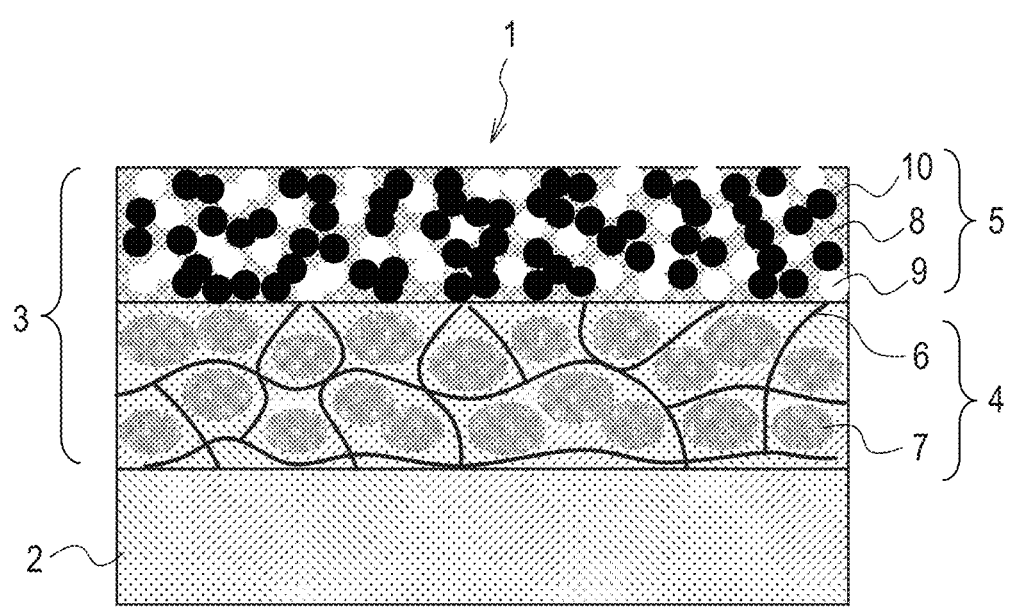
FIG. 2 is a schematic view showing another embodiment of the transparent member of the present invention.

FIG. 2 is a schematic view showing another embodiment of the transparent member of the present invention.

As with the embodiment shown in FIG. 1, a transparent member 1 of the present embodiment includes a substrate 2 and a stacked body 3 having an organic layer 4 and an inorganic porous layer 5 stacked on the substrate 2 in this order such that the both layers are in contact with each other.

The organic layer 4 contains an organic molecular chain network 6 and acidic group assemblies 7. The porous layer 5 includes a hydrophilic silicon oxide and contains a silicon oxide body 8 and pores 9.

The present embodiment differs from the embodiment shown in FIG. 1 in that the silicon oxide porous layer 5 contains silicon oxide particles 10 and the silicon oxide particles link together to form the silicon oxide body 8. Also in the present embodiment, the silicon oxide porous layer 5 is preferably free from organic substances as much as possible, and specifically, the silicon oxide porous layer 5 contains organic substances preferably at a C/Si element ratio of 3/100 or less.

The silicon oxide porous layer 5 preferably contains silicon oxide particles 10 in an amount of 80% by weight or more.

The shape of the silicon oxide particles 10 can be appropriately selected from various shapes including spherical, chain, disc, elliptical, rod-like, acicular, and square shapes. Specifically, the particles more preferably have a spherical or chain shape from the viewpoint of excellent film formability and higher porosity while sufficient film hardness is maintained.

In the present invention, chained particles usable as the silicon oxide particles 10 are a particle aggregate in which a plurality of particles are chained or beaded in a linear manner or a curved manner. Even when each particle included in chained silicon oxide particles has such an individual shape as to be clearly observable or the particles lose the respective shapes due to fusion or the like and form a film, the chained or beaded structure is maintained. Hence, voids among particles can be enlarged as compared with when spherical particles or the like are used, and a silicon oxide porous layer 5 having a high porosity can be formed.

Silicon oxide particles 10 having a spherical, disc, or elliptical shape preferably have an average particle diameter of 5 nm or more to 100 nm or less. If the average particle diameter is less than 5 nm, such a silicon oxide porous layer 5 may be highly likely to cause cracking due to remaining compressive stress at film formation. If the average particle diameter is more than 100 nm, an increase in diameter of particles causes light scattering, thus the transparency is degraded, and such a condition is thus unfavorable. The average particle diameter is more preferably 10 nm or more to 60 nm or less.

When silicon oxide particles 10 have a chain, rod-like, or acicular shape, the silicon oxide particles 10 are particles having a shape with a minor axis length and a major axis length, and the average minor axis length is preferably 5 nm or more to 40 nm or less and more preferably 8 nm or more to 30 nm or less. If silicon oxide particles 10 have an average minor axis length of less than 5 nm, the particles have an excessively large surface area, and reliability is highly likely to be reduced due to trapped water or chemical substances in an atmosphere. If the average minor axis length is more than 40 nm, scattering is caused due to the diameter of the particles, and such a condition is thus unfavorable. The ratio of major axis length/minor axis length is preferably 3 or more to 12 or less. If the ratio of major axis length/minor axis length is less than 3, an effect of increasing the porosity is difficult to be achieved, and if the ratio is more than 12, the average pore diameter is excessively large, and light scattering may occur to impair the transparency. The ratio of major axis length/minor axis length is more preferably 4 or more to 10 or less.

In the description, the average particle diameter of silicon oxide particles is an average Feret diameter. The average Feret diameter can be determined by image processing of an image observed under a transmission electron microscope. The image processing can be performed by using a commercially available image processing software such as Image-Pro Plus (trade name; manufactured by Nipppon Roper Media Cybernetics). In a certain image region, contrast adjustment is appropriately performed as needed, then particle measurement is performed to measure the mean Feret diameter of each particle, and the average is calculated.

As the silicon oxide particles 10, particles having shapes including perfect circular, elliptical, disc, rod-like, acicular, and square shapes may be appropriately mixed and used in addition to chained particles. To the whole silicon oxide particles 10, the proportion of particles having shapes other than the chain is preferably 40% by mass or less and more preferably 20% by mass or less. If particles having shapes other than the chain are contained at more than 40% by mass, the effect of reducing the refractive index by addition of a fluorine compound may not be achieved.

The silicon oxide particles 10 are hydrophilic silicon oxide particles and are preferably wet-synthesized particles produced from orthosilicic acid ($H_4SiO_4$) as a raw material by hydrothermal synthesis. This is because a silanol group (Si—OH) on the particle surface improves the dispersibility of silicon oxide particles in a solvent and improves the wettability of a silicon oxide porous layer 5 with water. The silanol group content that is determined from the number of —OH groups per Si atom is preferably 0.15 or more to 0.4 or less. If the silanol group content is less than 0.15, such a silicon oxide porous layer 5 has insufficient surface hydrophilicity, and the anti-fogging properties may not be expressed. If the content is more than 0.4, excess silanol groups trap water and are unlikely to discharge the trapped water, and the anti-fogging properties may not continue. The silanol group content is more preferably 0.2 or more to 0.35 or less.

Dry synthesized silicon oxide particles 10 can be used as the hydrophilic silicon oxide particles as long as many silanol groups have been formed on the surface in an acidic or alkaline aqueous solution.

The silicon oxide particles 10 are particles mainly including silicon oxide, but some of the Si elements may be replaced with other elements such as Al, Ti, Zn, Zr, and B, or a Si element may be bonded to an organic group. In such a case, of elements except oxygen and hydrogen, the content of elements other than Si is preferably 10% by atom or less and more preferably 5% by atom or less. If the content of elements other than Si is more than 10% by atom, silanol groups on the particle surface to react with a silicon oxide binder are reduced, and thus the scratch resistance may be degraded, or the hydrophilicity may be lost.

In order to improve the scratch resistance of the silicon oxide body 8, the silicon oxide particles 10 can be bonded together. The method of bonding silicon oxide particles 10 together includes a method of fixing the whole particles with a binder and a method of binding silicon oxide particles 10 together through activated silanol groups. The latter method includes a method of treating the surface of silicon oxide particles 10 with a strong acid or the like and a method of allowing silanol groups to adhere to the surface of silicon oxide particles 10.

The binder added for bonding silicon oxide particles 10 together is preferably a silicon oxide compound. A preferred example of the silicon oxide compound is a silicon oxide oligomer prepared by hydrolysis and condensation of a silicate ester.

When a silicon oxide compound is added as the binder, the amount thereof is preferably 1% by mass or more to 30% by mass or less relative to the silicon oxide particles 10. If the amount of the silicon oxide compound is less than 1% by mass, the scratch resistance may be insufficient, and if the amount is more than 30% by mass, the pores 9 may be partly buried to impair the anti-fogging properties. The amount of the silicon oxide compound is more preferably 4% by mass or more to 20% by mass or less.

To allow the transparent member 1 of the present invention to have an anti-reflective function, the silicon oxide porous layer 5 preferably has a film thickness of 70 nm or more to 150 nm or less from the viewpoint of a reduction in reflectance and an improvement in transmittance. If the film thickness is less than 70 nm, the film strength may be insufficient, and if the film thickness is more than 150 nm, the effect of reducing reflectance is unlikely to be achieved.

(Organic Layer)

The organic layer 4 contains an organic molecular chain network 6 and acidic group assemblies 7, and the organic molecular chain network 6 includes organic polymer chains and organic crosslinking chains.

Such organic polymer chains and organic crosslinking chains contain at least any of a CH—CH bond and a CH=CH bond in the chain thereof, may additionally contain a hetero atom such as oxygen and nitrogen, a carbonyl carbon, or an aromatic ring, and may contain a C—Si bond. However, a molecular chain linked through an unstable bond or an ionic bond, such as an M-O—C bond and —O-M$^+$, where M is a metal atom, is excluded from the organic polymer chains or the organic crosslinking chains in the present invention.

The organic crosslinking chain preferably has a carbon number of 3 or more to 30 or less. An organic crosslinking chain having a carbon number of less than 3 is short to reduce the distance between organic polymer chains, whereas an organic crosslinking chain having a carbon number of more than 30 increases the distance between organic polymer chains. This makes difficult to form an acidic group aggregate 7 capable of retaining a sufficient amount of water. The organic crosslinking chain more preferably has a carbon number of 6 or more to 20 or less.

The organic molecular chain network 6 including organic polymer chains and organic crosslinking chains has higher hydrophobicity and more excellent flexibility than a network crosslinked with a metal salt or the like. Hence, when the organic layer 4 comes into contact with water, the acidic group aggregate 7 traps water and peripheral acidic groups to form a more firmly hydrogen-bonded acidic group aggregate 7 in the organic layer 4. At that time, such a structure that the hydrophilic acidic group aggregate 7 is surrounded by the hydrophobic organic molecular chain network 6 is formed, and thus the surface hydrophobicity of the organic layer 4 is dramatically increased. If only the organic layer 4 were used, water droplets would be likely to adhere to the surface, and fogging would be caused in a short time. When the porous layer 5 is formed on the organic layer 4, a water repellent power of the moist organic layer 4 and a water spreading power of the porous layer 5 are simultaneously exerted, and thus water circulates by convection between the inside of the porous layer 5 and the inside of a water film formed thereon. Generally, water trapped in a porous layer is fixed and does not circulate by convection, and thus onto the surface of a porous body saturated with water, water droplets adhere to cause fogging. The transparent member 1 of the present invention, however, prevents water droplets from adhering due to water convection of the surface, and exerts anti-fogging properties over a long period of time.

The acidic group included in the acidic group aggregate 7 is preferably bonded to the organic polymer chain, and examples of the acidic group include a phenolic hydroxy group, a carboxyl group, a thiocarboxyl group, a sulfonamide group, and a sulfonic acid group. From the viewpoint of stable formation of the acidic group aggregate 7, the acidic group preferably has an acid dissociation constant pKa of 5 or less.

The organic layer 4 is preferably a cured product of an organic polymer having the acidic group and a crosslinking agent having two or more organic groups that are to react with the acidic group. In this case, the organic molecular chain network in the organic layer 4 is formed from a linking group generated by reaction of the acidic group of the organic polymer and the organic group of the crosslinking agent. From the viewpoint of reactivity with the acidic group or stability after the curing, the organic group is more preferably a cationic curable organic group. Examples of the cationic curable organic group include an epoxy group, an oxetanyl group, an epi sulfide group, a methylol group, an alkylated methylol group, an acetylated methylol group, and a vinyl ether group.

From the viewpoint of high reactivity with an organic group of the crosslinking agent and formation of a robust linking group, the acidic group is more preferably a carboxyl group and a thiocarboxyl group.

The organic layer 4 preferably has a film thickness of 100 nm or more to 5,000 nm or less. If the film thickness is less than 100 nm, the transparent member 1 of the present invention may have insufficient anti-fogging properties, and if the film thickness is more than 5,000 nm, the film thickness uniformity of the organic layer 4 may be impaired, and a planar transparent member may be difficult to produce.

(Substrate)

As the substrate 2, a glass, a resin, or the like having a visible light transmittance of 50% or more can be used. The shape thereof is not limited, and the substrate may have a flat face, a curved face, a concave face, a convex face, or a film-like shape.

The glass can be an inorganic glass containing zirconium oxide, titanium oxide, tantalum oxide, niobium oxide, hafnium oxide, lanthanum oxide, gadolinium oxide, silicon oxide, calcium oxide, barium oxide, sodium oxide, potassium oxide, boron oxide, or aluminum oxide, for example. The glass substrate can be a glass substrate formed by grind polishing, mold forming, or flow forming, for example.

Examples of the resin include polyethylene terephthalate, polyethylene naphthalate, triacetyl cellulose, acrylic resins, polycarbonate, cycloolefin polymers, and polyvinyl alcohol.

In order to improve the adhesion, strength, flatness, and the like of the substrate 2 or to exert functions such as anti-reflective properties and anti-glare properties, the substrate surface may be washed or polished, or an adhesion layer, a hard coat layer, or a refractive index adjustment layer may be provided on the substrate surface.

(Production Method)

A method for producing a transparent member 1 including a stacked body 3 on a substrate 2 includes a step of forming, on a substrate 2 or on another layer formed on a substrate 2, an organic layer 4 containing an organic molecular chain network 6 including an organic polymer chain and an organic crosslinking chain having a carbon number of 3 or more to 30 or less and containing an acidic group aggregate 7 by application of a solution and thermal curing and a step of forming, on the organic layer 4, a hydrophilic silicon oxide porous layer 5 by application of a liquid.

The solution used for forming the organic layer 4 preferably contains an organic polymer having the acidic group and a crosslinking agent having two or more organic groups that are to react with the acidic group.

Examples of the organic polymer having the acidic group include polymers having a phenolic hydroxy group, such as a phenol resin and poly(4-vinylphenol), and copolymers of them; polymers having a carboxyl group or a thiocarboxyl group, such as polyacrylic acid, polymethacrylic acid, polymaleic acid, poly(4-vinylbenzoic acid), and polyvinylthiocarboxylic acid, and copolymers of them; polymers having a sulfonamide group, such as polyethane sulfonamide and polyvinyl sulfonamide, and copolymers of them; and polymers having a sulfonic acid group, such as polyvinyl sulfonic acid, polystyrene sulfonic acid, and poly(acrylamide-tert-butyl sulfonic acid), and copolymers of them. From the viewpoint of solubility in various solvents or film formability, polymers having a carboxyl group or a thiocarboxyl group, such as polyacrylic acid, and copolymers of them are preferred.

The organic polymer having the acidic group preferably has a molecular weight of 1,000 or more to 500,000 or less. If the molecular weight is less than 1,000, such a polymer is likely to be eluted in an environment of high humidity, and if the molecular weight is more than 500,000, such a polymer has an excessively high viscosity to make the film formation difficult. The organic polymer more preferably has a molecular weight of 3,000 or more to 300,000 or less.

Examples of the crosslinking agent having two or more organic groups that are to react with the acidic group include compounds having a methylol group or an alkylated methylol group as the organic group to react with the acidic group, such as 1,3-bis(hydroxymethyl)urea, 1,3-bis(hydroxymethyl)-5-[1,3-bis(hydroxymethyl)ureido]hydantoin, 1,3,4,6-tetrakis(methoxymethyl)glycoluril, 1,3-bis(methoxymethyl)-4,5-dimethoxy-2-imidazolidinone, 1,3-bis(methoxymethyl)urea, 2,6-dihydroxymethyl-4-methylphenol, 2,4-dihydroxymethyl-6-methylphenol, 2,2-bis(4-hydroxy-3,5-dihydroxymethylphenyl)propane, and 2,4,6-tris[bis(methoxymethyl)amino]-1,3,5-triazine, or dimers or trimers of them; compounds having an epoxy group as the organic group to react with the acidic group, such as 1,3-butadiene diepoxide, 1,7-octadiene diepoxide, 1,5-hexadiene diepoxide, 2,2'-(2,2,3,3,4,4,5,5,6,6,7,7-dodecafluorooctane-1,8-diyl)bis(oxirane), 1,2-bis(2,3-epoxypropoxy)ethane, 1,4-bis(2,3-epoxypropoxy)butane, diglycidyl 1,2-cyclohexanedicarboxylate, 2,2-bis(4-glycidyloxyphenyl)propane, neopentyl glycol diglycidyl ether, pentaerythritol tetraglycidyl ether, tris(2,3-epoxypropyl) isocyanurate, tris(4,5-epoxypentyl) isocyanurate, 4,4'-methylenebis(N,N-diglycidylaniline), bis(4-glycidyloxyphenyl)methane, 3',4'-epoxycyclohexylmethyl 9,9-bis(4-glycidyloxyphenyl) fluorene, vinylcyclohexene dioxide, 3,4-epoxycyclohexanecarboxylate, bis((3,4-epoxycyclohexyl)methyl) adipate, 1,4-cyclohexanedimethanol (3,4-epoxycyclohexanecarboxylate), ε-caprolactone-modified 3',4'-epoxycyclohexylmethyl-3,4-epoxycyclohexanecarboxylate, or dimers or trimers of them; compounds having an oxetanyl group as the organic group to react with the acidic group, such as xylylenebisoxetane, 3-ethyl-3 {[(3-ethyloxetan-3-yl)methoxy]methyl}oxetane, bis[(3-ethyl-3-oxetanyl)methoxymethyl]biphenyl, and bis[(3-ethyloxetan-3-yl)methyl]benzene-1,4-dicarboxylate, or dimers or trimers of them; compounds having a vinyl ether group as the organic group to react with the acidic group, such as 1,4-butanediol divinyl ether, 1,4-bis[(ethenyloxy)methyl]cyclohexane, 1,1'-[oxybis(2,1-ethanediyloxy)]bisethene, and 3,6,9,12-tetraoxatetradeca-1,13-diene; and compounds having a plurality of organic groups to react with the acidic group, such as ethyloxetane methyl vinyl ether.

A product prepared by reacting silane alkoxide moieties of silane compounds each having a single organic group to react with the acidic group, such as 3-glycidyloxypropyltrimethoxysilane, 3-glycidyloxypropyltriethoxysilane, [8-(glycidyloxy)-n-octyl]trimethoxysilane, (3-glycidyloxypropyl)methyldimethoxysilane, (3-glycidyloxypropyl)methyldiethoxysilane, and 2-(3,4-epoxycyclohexyl)ethyltrimethoxysilane, may be used as a siloxane oligomer crosslinking agent having two or more organic groups.

These crosslinking agents may be used singly or in combination of two or more of them.

The amount of the crosslinking agent added is preferably 2 parts by weight or more to 40 parts by weight or less relative to the organic polymer. If the amount of the crosslinking agent is less than 2 parts by weight, a component may be eluted from the organic layer 4 in an environment of high humidity, and the transparency may be impaired. If the amount is more than 40 parts by weight, the organic layer 4 has excessively high hydrophobicity, and anti-fogging properties may not be expressed.

The solvent usable in the solution used for forming the organic layer 4 may be any solvent in which raw materials are uniformly dissolved and no reaction product is precipitated. Examples include water; monohydric alcohols such as methanol, ethanol, 1-propanol, 2-propanol, 1-butanol, 2-butanol, 2-methylpropanol, 1-pentanol, 2-pentanol, cyclopentanol, 2-methylbutanol, 3-methylbutanol, 1-hexanol, 2-hexanol, 3-hexanol, 4-methyl-2-pentanol, 2-methyl-1-pentanol, 2-ethylbutanol, 2,4-dimethyl-3-pentanol, 3-ethylbutanol, 1-heptanol, 2-heptanol, 1-octanol, and 2-octanol; dihydric or polyhydric alcohols such as ethylene glycol and triethylene glycol; ether alcohols such as methoxyethanol, ethoxyethanol, propoxyethanol, isopropoxyethanol, butoxyethanol, 1-methoxy-2-propanol, 1-ethoxy-2-propanol, and 1-propoxy-2-propanol; ethers such as dimethoxyethane, Diglyme, tetrahydrofuran, dioxane, diisopropyl ether, dibutyl ether, and cyclopentyl methyl ether; esters such as ethyl formate, ethyl acetate, n-butyl acetate, ethylene glycol monomethyl ether acetate, ethylene glycol monoethyl ether acetate, ethylene glycol monobutyl ether acetate, and propylene glycol monomethyl ether acetate; various ketones such as acetone, methyl ethyl ketone, methyl isobutyl ketone, cyclopentanone, and cyclohexanone; and aprotic polar solvents such as N-methylpyrrolidone, N,N-dimethylformamide, N,N-dimethylacetamide, and ethylene carbonate. The solvents may be used as a mixture of two or more of them.

In particular, from the viewpoint of satisfactory solubility of an organic polymer having an acidic group, water, alcohols, and ether alcohols are preferred.

In order to improve the wettability of the solution used for forming the organic layer 4 on a substrate, to increase the film thickness uniformity, to improve the adhesion of the organic layer 4 to a substrate or the like, or to reduce the curing time, additives can be added in addition to the organic polymer having an acidic group or the crosslinking agent. Examples of the additive include a surfactant, a leveling agent, an adhesion accelerator, and an acid catalyst. The amount added is preferably 2 parts by weight or less relative to the organic polymer having an acidic group.

In the solution used for forming the organic layer 4, the total concentration of the organic polymer and the crosslinking agent is preferably 1% by mass or more to 40% by mass or less. A solution having a concentration of less than 1% by mass may give an excessively small film thickness, whereas a solution having a concentration of more than 40% by mass may have an excessively high viscosity, and the film thickness uniformity may be impaired in film formation.

The step of forming a silicon oxide porous layer 5 is preferably a step of using a dispersion liquid of silicon oxide particles 10.

The dispersion liquid of silicon oxide particles 10 used for forming the silicon oxide porous layer 5 can be prepared by a method of diluting, with water or another solvent, a dispersion liquid of spherical or chained silicon oxide particles produced by a wet method such as hydrothermal synthesis, a method of replacing the solvent of a dispersion liquid prepared in a similar manner to the above with an intended solvent by distillation or ultrafiltration, or a method of dispersing silicon oxide particles 10 synthesized by dry method, such as fumed silica particles, in water or another solvent by sonication or with a bead mill, for example.

The binder added for bonding silicon oxide particles 10 together is preferably a silicon oxide compound. A preferred example of the silicon oxide compound is a silicon oxide oligomer prepared by hydrolysis and condensation of a silicate ester.

Examples of the method of adding a silicon oxide oligomer include a method of mixing a silicon oxide oligomer solution previously prepared in water or another solvent with a dispersion liquid of the silicon oxide particles 10 and a method in which a raw material of a silicon oxide oligomer is mixed with a dispersion liquid of the silicon oxide particles 10 and then the raw material is converted into a silicon oxide oligomer. The silicon oxide oligomer is prepared through hydrolysis and condensation of a silicate ester such as methyl silicate and ethyl silicate in a solvent or a dispersion liquid by addition of water, an acid, or a base. The acid usable in the reaction is, for example, hydrochloric acid, nitric acid, methanesulfonic acid, trifluoroacetic acid, trifluoromethanesulfonic acid, phosphoric acid, or p-toluenesulfonic acid, and the base is, for example, ammonia or various amines. An acid or a base is appropriately selected in consideration of the solubility in a solvent or the reactivity of a silicate ester. To prepare a binder solution, the solution can be heated at a temperature of 80° C. or less.

The silicon oxide condensate (oligomer) contained in the binder solution preferably has a weight-average molecular weight of 500 or more to 3,000 or less in terms of polystyrene. If the weight-average molecular weight is less than 500, a product after curing is likely to cause cracking, and the stability as a paint is degraded. If the weight-average molecular weight is more than 3,000, such a solution has a higher viscosity, thus the binder is likely to contain inhomogeneous voids, and large voids are likely to be formed.

The solvent usable for preparing the dispersion liquid of the silicon oxide particles 10 may be any solvent in which raw materials are uniformly dissolved and no reaction product is precipitated. Examples include monohydric alcohols such as methanol, ethanol, 1-propanol, 2-propanol, 1-butanol, 2-butanol, 2-methylpropanol, 1-pentanol, 2-pentanol, cyclopentanol, 2-methylbutanol, 3-methylbutanol, 1-hexanol, 2-hexanol, 3-hexanol, 4-methyl-2-pentanol, 2-methyl-1-pentanol, 2-ethylbutanol, 2,4-dimethyl-3-pentanol, 3-ethylbutanol, 1-heptanol, 2-heptanol, 1-octanol, and 2-octanol; dihydric or polyhydric alcohols such as ethylene glycol and triethylene glycol; ether alcohols such as methoxyethanol, ethoxyethanol, propoxyethanol, isopropoxyethanol, butoxyethanol, 1-methoxy-2-propanol, 1-ethoxy-2-propanol, and 1-propoxy-2-propanol; ethers such as dimethoxyethane, Diglyme, tetrahydrofuran, dioxane, diisopropyl ether, dibutyl ether, and cyclopentyl methyl ether; esters such as ethyl formate, ethyl acetate, n-butyl acetate, ethylene glycol monomethyl ether acetate, ethylene glycol monoethyl ether acetate, ethylene glycol monobutyl ether acetate, and propylene glycol monomethyl ether acetate; various aliphatic or alicyclic hydrocarbons such as n-hexane, n-octane, cyclohexane, cyclopentane, and cyclooctane; various aromatic hydrocarbons such as toluene, xylene, and ethylbenzene; various ketones such as acetone, methyl ethyl ketone, methyl isobutyl ketone, cyclopentanone, and cyclohexanone; various chlorinated hydrocarbons such as chloroform, methylene chloride, carbon tetrachloride, and tetrachloroethane; and aprotic polar solvents such as N-methylpyrrolidone, N,N-dimethylformamide, N,N-dimethylacetamide, and ethylene carbonate. The solvents may be used as a mixture of two or more of them.

Examples of the method of applying a solution for forming the organic layer 4 or a liquid for forming the silicon oxide porous layer 5 include spin coating, spraying, blade coating, roll coating, slit coating, printing, and dip coating. To produce an optical member having a three-dimensionally complicated shape such as a concave face, spin coating or spraying is preferably adopted from the viewpoint of film thickness uniformity.

Application of a solution or a liquid for forming the organic layer 4 or the silicon oxide porous layer 5 is followed by drying and/or curing. The drying and curing are steps mainly for removing a solvent or for advancing the reaction of a silicon oxide binder together or a silicon oxide binder with silicon oxide particles. The temperature for the drying and curing is preferably 20° C. or more to 200° C. or less and more preferably 60° C. or more to 150° C. or less. If the temperature for the drying and curing is less than 20° C., a solvent is left, and the abrasion resistance is degraded. If the temperature for the drying and curing is more than 200° C., a binder is too rapidly cured, and a cured binder is likely to cause cracking. The time for the drying and curing is preferably 5 minutes or more to 24 hours or less and more preferably 15 minutes or more to 5 hours or less. If the time for the drying and curing is less than 5 minutes, a solvent is partially left, and partial fogging is likely to be caused. If the time is more than 24 hours, a formed film is likely to cause cracking.

Application Example

Figure 24:
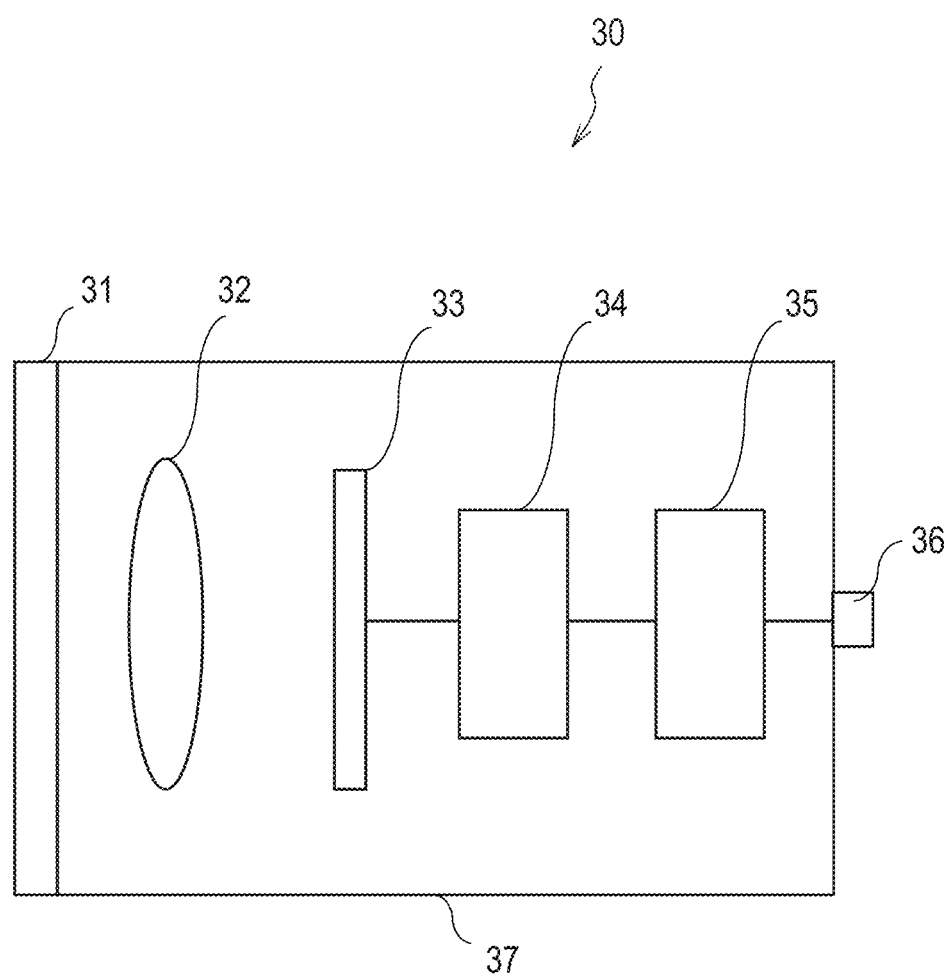
FIG. 24 is a view showing a constitution example of an imaging apparatus including a transparent member pertaining to the present invention as an optical system.

As a preferred application example of the transparent member pertaining to the present invention, an imaging apparatus in which the transparent member is integrated into an optical system will be described. FIG. 24 is an outline of a constitution example of an imaging apparatus.

An imaging apparatus 30 has a space surrounded by a transparent protective member 31 and a housing 37 and includes, in the space, a lens 32, an image sensor 33, an image engine 34, a compression output circuit 35, and an output unit 36. In the imaging apparatus 30, the protective member 31 and the lens 32 constitute an optical system.

An image incident from the outside is guided through the protective member 31 and the lens 32 to the image sensor 33, and is converted by the image sensor 33 into image analog signals (electric signals), and the image analog signals are output. The image analog signals output from the image sensor 33 are converted by the image engine 34 into image digital signals, and the image digital signals output from the image engine 34 are compressed in the compression output circuit 35 into a digital file. The image engine 34 may perform, in a process of converting image analog signals into image digital signals, adjustment treatment of image qualities including luminance, contrast, color correction, and noise removal. The signals output from the compression output circuit 35 are output from the output unit 36 through wirings to an external device.

The protective member 31 includes a substrate 2 and a stacked body having an organic layer and an inorganic porous layer stacked on the substrate in this order from the substrate side such that the both layers are in contact with each other and is so installed that the face having the stacked body provided thereon faces the inside of the housing 37.

With such a structure, ventilation is limited between the space surrounded by the protective member 31 and the housing 37 (the inside of the housing) and the outside, and the space slowly follows temperature variations in the external environment. For example, when the external temperature suddenly drops, the protective member positioned at the boundary between the outside and the inside of the housing may have a lower temperature than the dew-point temperature in the housing. If a protective member having no anti-fogging properties were in such a condition, water droplets would adhere to the face of the protective member inside the housing and cause fogging. In the case of the protective member 31 pertaining to the present invention, when the protective member 31 has a temperature lower than the dew-point temperature in the housing, and the amount of water to be water droplets is less than a certain amount, the water in the space is absorbed by the organic layer, and the surface of the protective member 31 is prevented from causing fogging. When the amount of water to be water droplets further increases, water not absorbed by the organic layer is smoothly spread on the inorganic porous film to form a water film on the surface of the inorganic porous film. Hence, water droplets to cause fogging are not formed on the surface of the optical lens 32, and fogging can be prevented.

The imaging apparatus 30 can constitute an imaging system together with a pan tilt to adjust the angle of view, a controller to control imaging conditions and the like, a memory to store captured image data, a transfer means to transfer date output from the output unit 35 to the exterior, and the like.

EXAMPLES

The present invention will next be described in further detail with reference to examples. The following examples will describe an example transparent member having an anti-reflective function. The present invention is not intended to be limited to the following examples without departing from the scope of the invention.

(Preparation of Particle Dispersion Liquids and Organic Polymer Solutions)

(1) Preparation of Silicon Oxide Particle Dispersion Liquid 1

From 500 g of a dispersion liquid of chained silicon oxide particles in 2-propanol (IPA) (manufactured by Nissan Chemical Industries, Ltd.; IPA-ST-UP (trade name); an average particle diameter of 12 nm, a solid concentration of 15% by mass), IPA was removed by evaporation while 1-ethoxy-2-propanol was added, giving 2,060.8 g of a dispersion liquid of chained silicon oxide particles in 1-ethoxy-2-propanol having a solid concentration of 3.64% by mass.

To a solution of 62.6 g of ethyl silicate and 36.8 g of 1-ethoxy-2-propanol in another container, 54 g of 0.01 mol/L diluted hydrochloric acid was gradually added, and the whole was stirred at room temperature for 90 minutes and then was heated at 40° C. for 1 hour, giving a silicon oxide oligomer solution having a solid concentration of 11.8% by mass.

To the dispersion liquid of chained silicon oxide particles in 1-ethoxy-2-propanol, 95.5 g of the silicon oxide oligomer solution as a binder was gradually added, and the whole was stirred at room temperature for 2 hours, giving a chained silicon oxide particle dispersion liquid 1 (hereinafter also simply called coating solution 1).

The coating solution 1 was subjected to particle diameter distribution measurement (Zetasizer Nano ZS (trade name) manufactured by Malvern) by dynamic light scattering to ascertain that chained silicon oxide particles having a minor axis length of 11 nm and a major axis length of 77 nm were dispersed.

(2) Preparation of Silicon Oxide Particle Dispersion Liquid 2

To 370 g of a dispersion liquid of spherical silicon oxide particles in 1-methoxy-2-propanol (hereinafter called PGME) (manufactured by Nissan Chemical Industries, Ltd., PGM-ST (trade name), an average particle diameter of 12 nm, a solid concentration of 30% by mass), 1-ethoxy-2-propanol was added to give 2,018.2 g of a dispersion liquid of spherical silicon oxide particles in 1-ethoxy-2-propanol having a solid concentration of 5.5% by mass.

To a solution of 62.6 g of ethyl silicate and 36.8 g of 1-ethoxy-2-propanol in another container, 54 g of 0.01 mol/L diluted hydrochloric acid was gradually added, and the whole was stirred at room temperature for 90 minutes and then was heated at 40° C. for 1 hour, giving a silicon oxide oligomer solution having a solid concentration of 11.8% by mass.

To the dispersion liquid of spherical silicon oxide particles in 1-ethoxy-2-propanol, 94.1 g of the silicon oxide oligomer solution as a binder was gradually added, and the whole was stirred at room temperature for 2 hours, giving a spherical silicon oxide particle dispersion liquid 2 (hereinafter also simply called coating solution 2).

The coating solution 2 was subjected to particle diameter distribution measurement (Zetasizer Nano ZS manufactured by Malvern) by dynamic light scattering to ascertain that spherical silicon oxide particles having a particle diameter of 15 nm were dispersed.

(3) Preparation of Polyacrylic Acid Solution 3

In 750 g of a mixed solvent of PGME and pure water (mass ratio: PGME/pure water=7/3), 240 g of polyacrylic acid (manufactured by Wako Pure Chemical Industries, Ltd.; an average molecular weight of 25,000) as an organic polymer having a carboxyl group (pKa=4.0 to 4.6) was dissolved to give 24% by mass polyacrylic acid solution 3.

(4) Preparation of Polyacrylic Acid Solutions 4 to 7

To 50 g of the polyacrylic acid solution 3, 3.9 g of 3-glycidyloxypropyltrimethoxysilane (manufactured by Shin-Etsu Chemical; KBM-403 (trade name)) was added, and the whole was stirred for 2 hours, giving a polyacrylic acid solution 4. By gas chromatography measurement, methanol formation was observed during the stirring, and this indicated that the added 3-glycidyloxypropyltrimethoxysilane was hydrolyzed and condensed to form an oligomer.

The polyacrylic acid solution 4 was diluted with a mixed solvent of PGME and pure water (mass ratio: PGME/pure water=7/3) twice, three times, or six times, giving solutions having different concentrations as polyacrylic acid solutions 5, 6, and 7.

(5) Preparation of Polyacrylic Acid Solution 8

To 50 g of the polyacrylic acid solution 3, 3.9 g of 2-(3,4-epoxycyclohexyl)ethyltrimethoxysilane (manufactured by Shin-Etsu Chemical; KBM-303 (trade name)) was added, and the whole was stirred for 2 hours, giving a polyacrylic acid solution 8. Methanol formation was observed during the stirring, and this indicated that the added 2-(3,4-epoxycyclohexyl)ethyltrimethoxysilane was hydrolyzed and condensed to form an oligomer.

(6) Preparation of Polyacrylic Acid Solutions 9 and 10

To 50 g of the polyacrylic acid solution 3, 1.8 g of 1,3,4,6-tetrakis(methoxymethyl)glycoluril (manufactured by Tokyo Chemical Industry Co., Ltd.) and 0.24 g of 3-glycidyloxypropyltrimethoxysilane were added, and the whole was stirred for 2 hours. The resulting polyacrylic acid solution was diluted with a mixed solvent of PGME and pure water (mass ratio: PGME/pure water=7/3) twice or six times, giving solutions having different concentrations as polyacrylic acid solutions 9 and 10.

(7) Preparation of Polyacrylic Acid Solution 11

To 50 g of the polyacrylic acid solution 3, 2.4 g of 2,4,6-tris[bis(methoxymethyl)amino]-1,3,5-triazine (manufactured by SANWA Chemical; Nikalac MX-706 (trade name)) and 0.24 g of 3-glycidyloxypropyltrimethoxysilane were added, and the whole was stirred for 2 hours. The resulting polyacrylic acid solution was diluted with a mixed solvent of PGME and pure water (mass ratio: PGME/pure water=7/3) twice, giving a polyacrylic acid solution 11.

(8) Measurement of Film Thickness

A variable angle spectroscopic ellipsometer (manufactured by J. A. Woollam JAPAN Co., Inc.; VASE (trade name)) was used for measurement in a wavelength range from 380 nm to 800 nm, and the result was analyzed to determine the film thickness.

(9) Measurement of Refractive Index

A variable angle spectroscopic ellipsometer was used for measurement in a wavelength range from 380 nm to 800 nm to determine the refractive index at a wavelength of 550 nm.

(10) Evaluation of Reflectance

A reflectance spectrophotometer (manufactured by Olympus Corporation; USPM-RU (trade name)) was used to measure absolute reflectances in a wavelength range from 380 nm to 780 nm, and the average reflectance in a wavelength range from 450 to 650 nm was calculated. The average reflectance was evaluated on the basis of the criteria shown below.

A: having an average of not more than 0.5%

B: having an average of more than 0.5% and not more than 1.0%

C: having an average of more than 1.0%

(11) Measurement of Contact Angle of Pure Water

An automatic contact angle meter (manufactured by Kyowa Interface Science Co., Ltd.; DMo-701 (trade name)) was used to determine a contact angle in an environment at 23° C. and 40% RH when 2 μL of a pure water droplet was brought into contact. The measurement results are shown in Table 1.

(12) Evaluation of Anti-Fogging Properties

With an anti-fogging property evaluation apparatus (manufactured by Kyowa Interface Science Co., Ltd.; AFA-2 (trade name)), transmission images were recorded every 5 seconds for 600 seconds while a transparent substrate allowed to stand in an atmosphere at 25° C. and 70% RH was cooled to 15° C. The transmission images were subjected to compression anti-fogging index analysis, and changes in compression anti-fogging index with time were plotted.

From the obtained plots, the time until the compression anti-fogging index reached 40 or less was determined, and the anti-fogging properties were evaluated on the basis of the criteria shown below.

A: not less than 300 seconds

B: not less than 150 seconds and less than 300 seconds

C: less than 150 seconds

Example 1

In Example 1, on a disk-shaped glass substrate (nd=1.52) having a diameter (φ) of 70 mm and a thickness of 3 mm, an appropriate amount of the polyacrylic acid solution 4 was dropped, then was subjected to spin coating at 1,200 rpm for 30 seconds, and was subjected to thermal curing at 140° C. for 30 minutes in a hot air circulating oven, giving an organic layer (lower layer) having a film thickness of 3,100 nm. On the organic layer, an appropriate amount of the silicon oxide particle dispersion liquid 1 was dropped, then was subjected to spin coating at 4,000 rpm for 20 seconds, and was heated at 140° C. for 30 minutes in a hot air circulating oven, giving a chained silicon oxide particle porous layer (surface layer) having a film thickness of 120 nm on the organic layer.

Figure 3:
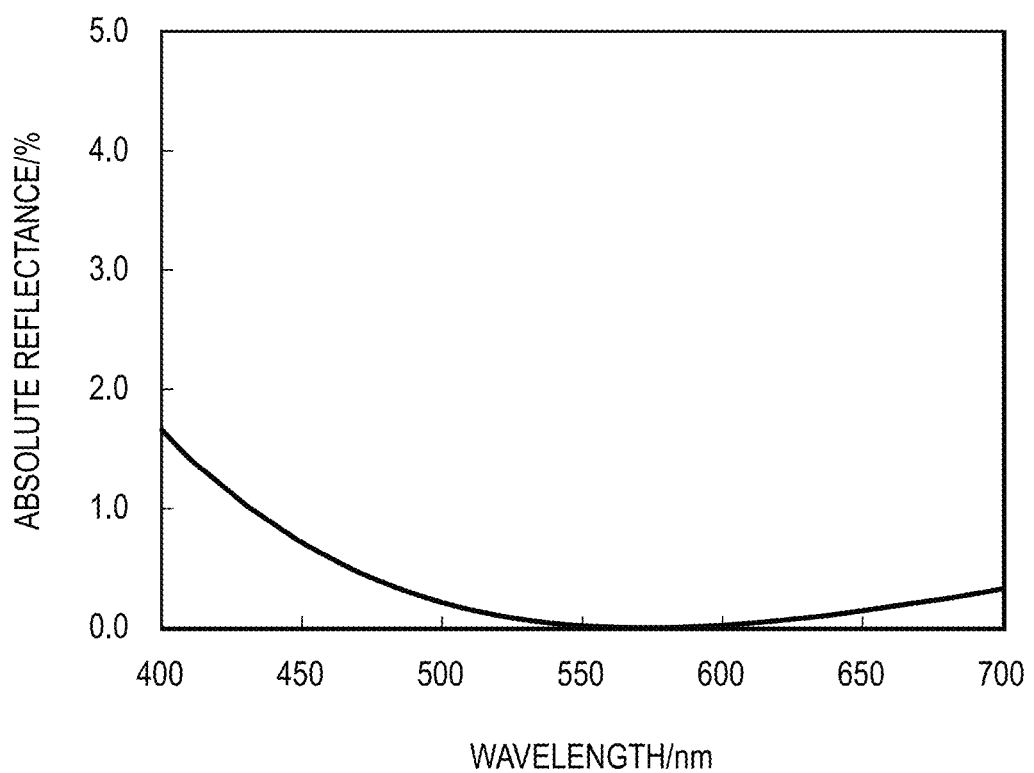
FIG. 3 is a graph showing absolute reflectance of a transparent member in Example 1.
Figure 4:
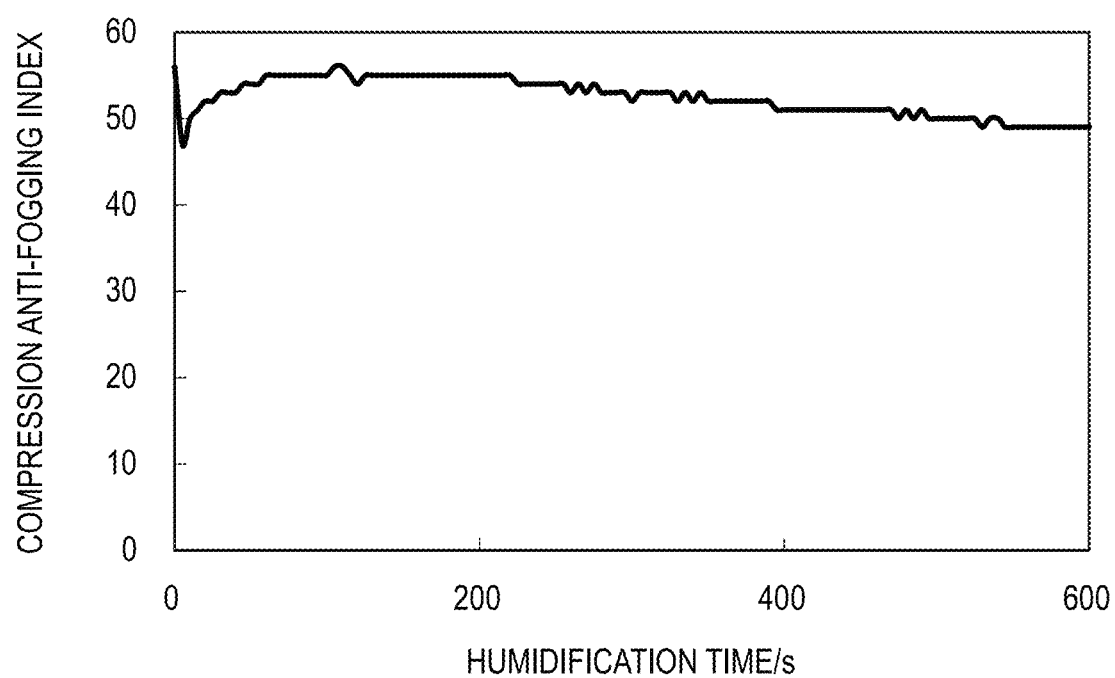
FIG. 4 is a graph showing changes in compression anti-fogging index with humidification time of the transparent member in Example 1.

The obtained porous layer had a refractive index of 1.235, an average reflectance of 0.17% (FIG. 3), and a contact angle of pure water of 9°. The porosity determined from the refractive index was 49%. In the anti-fogging property evaluation, no fogging was observed even after 600 seconds (FIG. 4), and the average reflectance after the anti-fogging property evaluation was 0.18%, which was substantially the same as before the evaluation. The evaluation results are shown in Table 1.

TABLE 1

| | Surface layer (porous layer) | | | | Lower layer (organic layer) | | | | Evaluation | | | |
|---|---|---|---|---|---|---|---|---|---|---|---|---|
| | Type | Film thickness, nm | Refractive index λ: 550 nm | Porosity | Organic polymer having acidic group | Organic crosslinking agent (parts by weight) | Film thickness, nm | Substrate | Pure water contact angle° | Anti-fogging properties | Reflectance after film formation | Reflectance after anti-fogging property evaluation |
| Example 1 | Chained silicon oxide particle porous layer | 120 | 1.235 | 49% | Polyacrylic acid | Condensate of KBM-403 (32) | 3100 | BK-7 | 9 | A | A | A |
| Example 2 | | 121 | 1.235 | 49% | | | 980 | | 9 | A | A | A |
| Example 3 | | 120 | 1.235 | 49% | | | 490 | | 8 | A | A | A |
| Example 4 | | 120 | 1.235 | 49% | | | 250 | | 9 | A | A | A |
| Example 5 | | 120 | 1.235 | 49% | | Condensate of KBM-303 (32) | 3040 | | 8 | A | A | A |
| Example 6 | | 120 | 1.235 | 49% | | TMG (15) + condensate of KBM-403 (2) | 1050 | | 9 | A | A | A |
| Example 7 | | 120 | 1.235 | 49% | | | 230 | | 9 | A | A | A |
| Example 8 | | 123 | 1.236 | 49% | | | 1070 | Polycarbonate | 10 | A | A | A |
| Example 9 | Spherical silicon oxide particle porous layer | 120 | 1.235 | 49% | | MX-706 (20) + condensate of KBM-403 (2) | 1020 | BK-7 | 9 | A | A | A |
| Example 10 | | 105 | 1.313 | 32% | | Condensate of KBM-403 (32) | 980 | | 7 | A | B | B |
| Example 11 | | 105 | 1.313 | 32% | | | 220 | | 8 | A | B | B |
| Example 12 | | 104 | 1.313 | 32% | | TMG (15) + condensate of KBM-403 (2) | 1040 | | 7 | A | A | A |
| Example 13 | | 108 | 1.314 | 32% | | | 1080 | | 8 | A | A | B |
| Example 14 | Silicon oxide porous layer | 105 | 1.313 | 32% | | MX-706 (20) + condensate of KBM-403 (2) | 1000 | BK-7 | 7 | A | B | B |
| Example 15 | | 110 | 1.265 | 42% | | Condensate of KBM-403 (32) | 980 | | 7 | A | A | A |
| Comparative Example 1 | Chained silicon oxide porous layer | 122 | 1.234 | 49% | None | None | — | BK-7 | 9 | C | A | A |
| Comparative Example 2 | Spherical silicon oxide particle porous layer | 107 | 1.312 | 32% | | | — | | 7 | C | B | B |
| Comparative Example 3 | Silicon oxide porous layer | 110 | 1.265 | 42% | Polyacrylic acid | | — | | 7 | C | A | A |
| Comparative Example 4 | None | — | — | — | | Condensate of KBM-403 (32) | 3080 | | 43 | B | C | C |
| Comparative Example 5 | | — | — | — | | | 500 | | 41 | C | C | C |
| Comparative Example 6 | | — | — | — | | TMG (15) + condensate of KBM-403(2) | 1050 | | 37 | C | C | C |
| Comparative Example 7 | Chained silicon oxide particles | 117 | 1.275 | 0.61 | | None | 3150 | | 9 | B | A | C |

(Meanings of abbreviations in Table 1)
KBM-403: 3-glycidyloxypropyltrimethoxysilane
KBM-303: 2-(3,4-epoxycyclohexyl)ethyltrimethoxysilane
TMG: 1,3,4,6-tetrakis(methoxymethyl)glycoluril
MX-706: 2,4,6-tris[bis(methoxymethyl)amino]-1,3,5-triazine Example 2

In Example 2, on a disk-shaped glass substrate (nd=1.52) having a diameter (φ) of 70 mm and a thickness of 3 mm, an appropriate amount of the polyacrylic acid solution 5 was dropped, then was subjected to spin coating at 3,000 rpm for 30 seconds, and was subjected to thermal curing at 140° C. for 30 minutes in a hot air circulating oven, giving an organic layer having a film thickness of 980 nm. Subsequently, the same procedure as in Example 1 was performed to form a chained silicon oxide particle porous layer on the organic layer.

The obtained porous layer had an average reflectance of 0.18%. In the anti-fogging property evaluation, no fogging was observed even after 600 seconds, and the average reflectance after the anti-fogging property evaluation was 0.18%, which was the same as before the evaluation.

Example 3

In Example 3, on a disk-shaped glass substrate (nd=1.52) having a diameter (φ) of 70 mm and a thickness of 3 mm, an appropriate amount of the polyacrylic acid solution 6 was dropped, then was subjected to spin coating at 3,000 rpm for 30 seconds, and was subjected to thermal curing at 140° C. for 30 minutes in a hot air circulating oven, giving an organic layer having a film thickness of 490 nm. Subsequently, the same procedure as in Example 1 was performed to form a chained silicon oxide particle porous layer on the organic layer.

Figure 5:
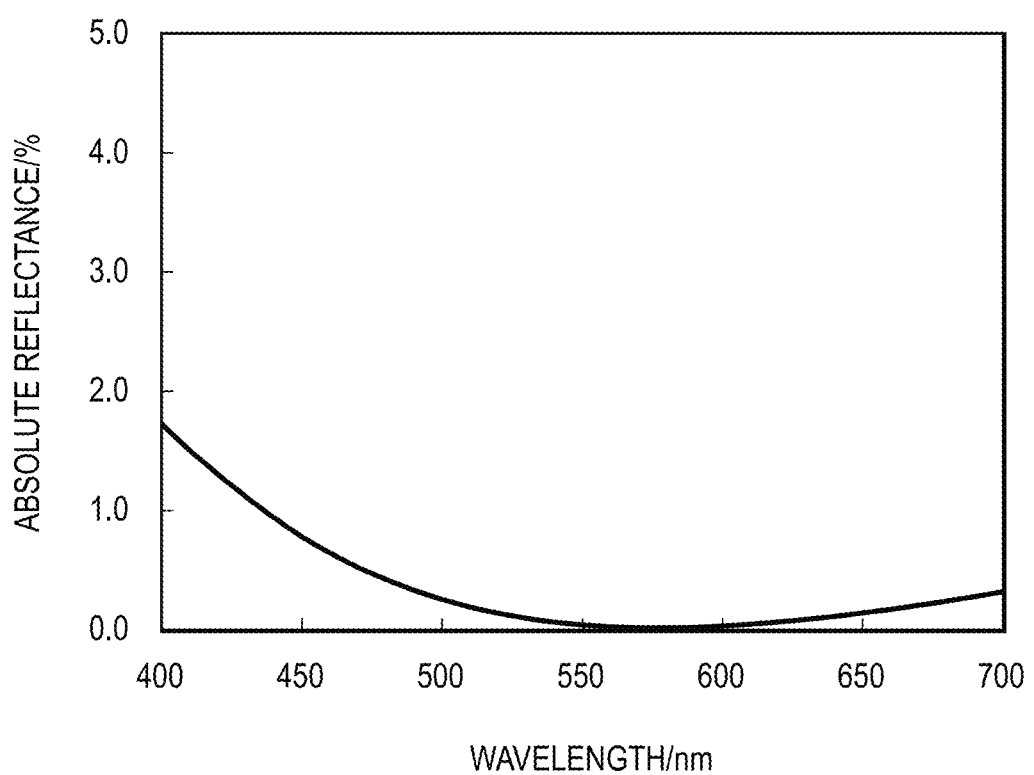
FIG. 5 is a graph showing absolute reflectance of a transparent member in Example 3.
Figure 6:
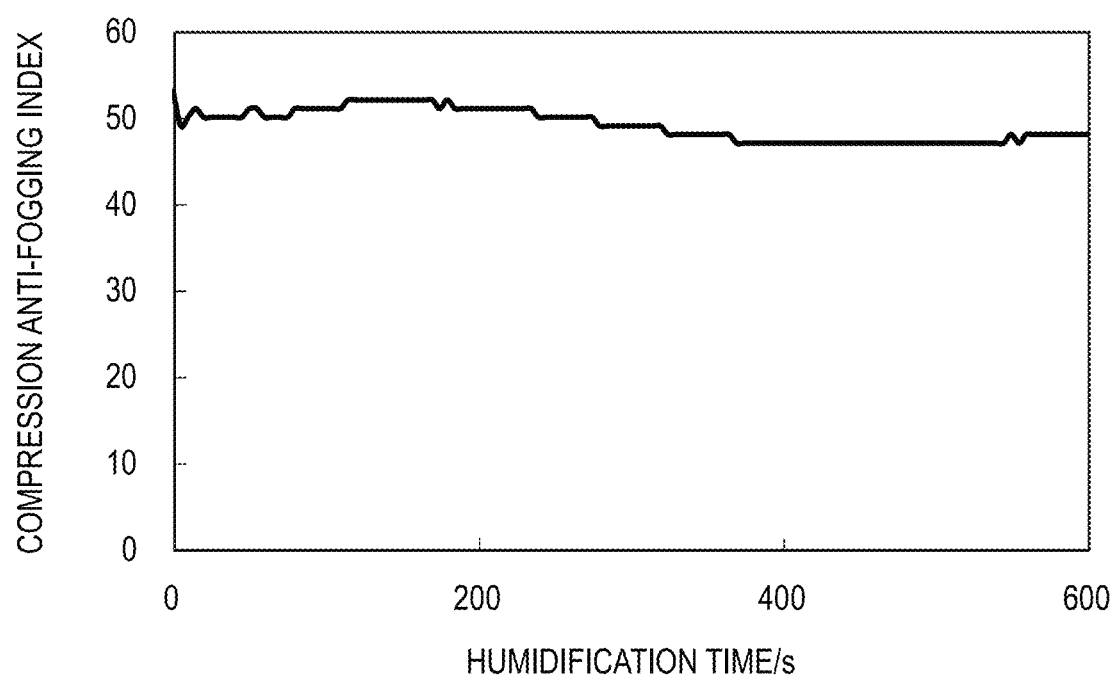
FIG. 6 is a graph showing changes in compression anti-fogging index with humidification time of the transparent member in Example 3.

The obtained porous layer had an average reflectance of 0.17% (FIG. 5). In the anti-fogging property evaluation, no fogging was observed even after 600 seconds (FIG. 6), and the average reflectance after the anti-fogging property evaluation was 0.17, which was the same as before the evaluation.

Example 4

In Example 4, on a disk-shaped glass substrate (nd=1.52) having a diameter (φ) of 70 mm and a thickness of 3 mm, an appropriate amount of the polyacrylic acid solution 7 was dropped, then was subjected to spin coating at 3,000 rpm for 30 seconds, and was subjected to thermal curing at 140° C. for 30 minutes in a hot air circulating oven, giving an organic layer having a film thickness of 250 nm. Subsequently, the same procedure as in Example 1 was performed to form a chained silicon oxide particle porous layer on the organic layer.

The obtained porous layer had an average reflectance of 0.17%. In the anti-fogging property evaluation, no fogging was observed even after 600 seconds, and the average reflectance after the anti-fogging property evaluation was 0.18%, which was substantially the same as before the evaluation.

Example 5

In Example 5, on a disk-shaped glass substrate (nd=1.52) having a diameter (φ) of 70 mm and a thickness of 3 mm, an appropriate amount of the polyacrylic acid solution 8 was dropped, then was subjected to spin coating at 1,200 rpm for 30 seconds, and was subjected to thermal curing at 140° C. for 30 minutes in a hot air circulating oven, giving an organic layer having a film thickness of 3,040 nm. Subsequently, the same procedure as in Example 1 was performed to form a chained silicon oxide particle porous layer on the organic layer.

The obtained porous layer had an average reflectance of 0.18%. In the anti-fogging property evaluation, no fogging was observed even after 600 seconds, and the average reflectance after the anti-fogging property evaluation was 0.19%, which was substantially the same as before the evaluation.

Example 6

In Example 6, on a disk-shaped glass substrate (nd=1.52) having a diameter (φ) of 70 mm and a thickness of 3 mm, an appropriate amount of the polyacrylic acid solution 9 was dropped, then was subjected to spin coating at 3,000 rpm for 30 seconds, and was subjected to thermal curing at 140° C. for 30 minutes in a hot air circulating oven, giving an organic layer having a film thickness of 1,050 nm. Subsequently, the same procedure as in Example 1 was performed to form a chained silicon oxide particle porous layer on the organic layer.

Figure 7:
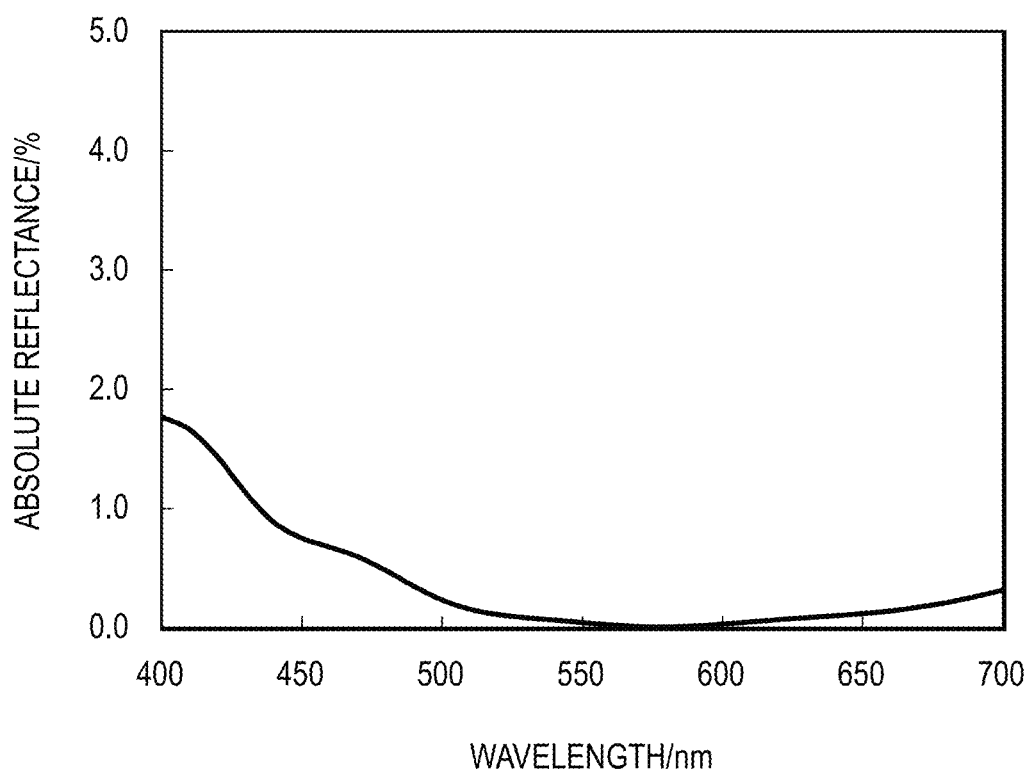
FIG. 7 is a graph showing absolute reflectance of a transparent member in Example 6.
Figure 8:
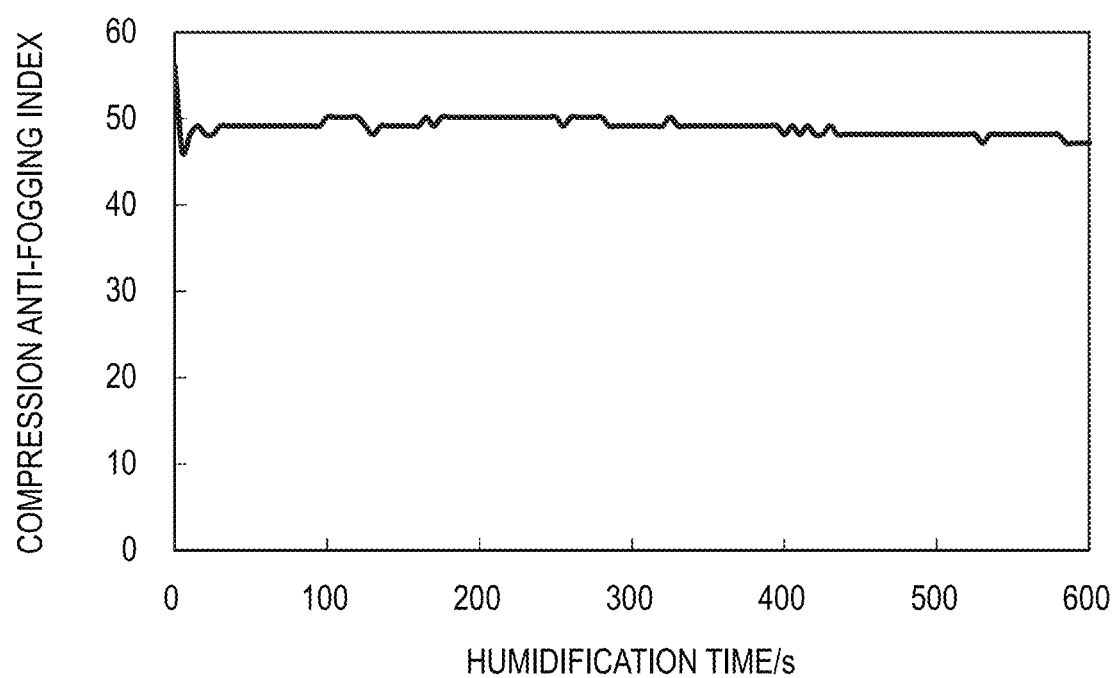
FIG. 8 is a graph showing changes in compression anti-fogging index with humidification time of the transparent member in Example 6.

The obtained porous layer had an average reflectance of 0.19% (FIG. 7). In the anti-fogging property evaluation, no fogging was observed even after 600 seconds (FIG. 8), and the average reflectance after the anti-fogging property evaluation was 0.19%, which was the same as before the evaluation.

Example 7

In Example 7, on a disk-shaped glass substrate (nd=1.52) having a diameter (φ) of 70 mm and a thickness of 3 mm, an appropriate amount of the polyacrylic acid solution 10 was dropped, then was subjected to spin coating at 3,000 rpm for 30 seconds, and was subjected to thermal curing at 140° C. for 30 minutes in a hot air circulating oven, giving an organic layer having a film thickness of 230 nm. Subsequently, the same procedure as in Example 1 was performed to form a chained silicon oxide particle porous layer on the organic layer.

Figure 9:
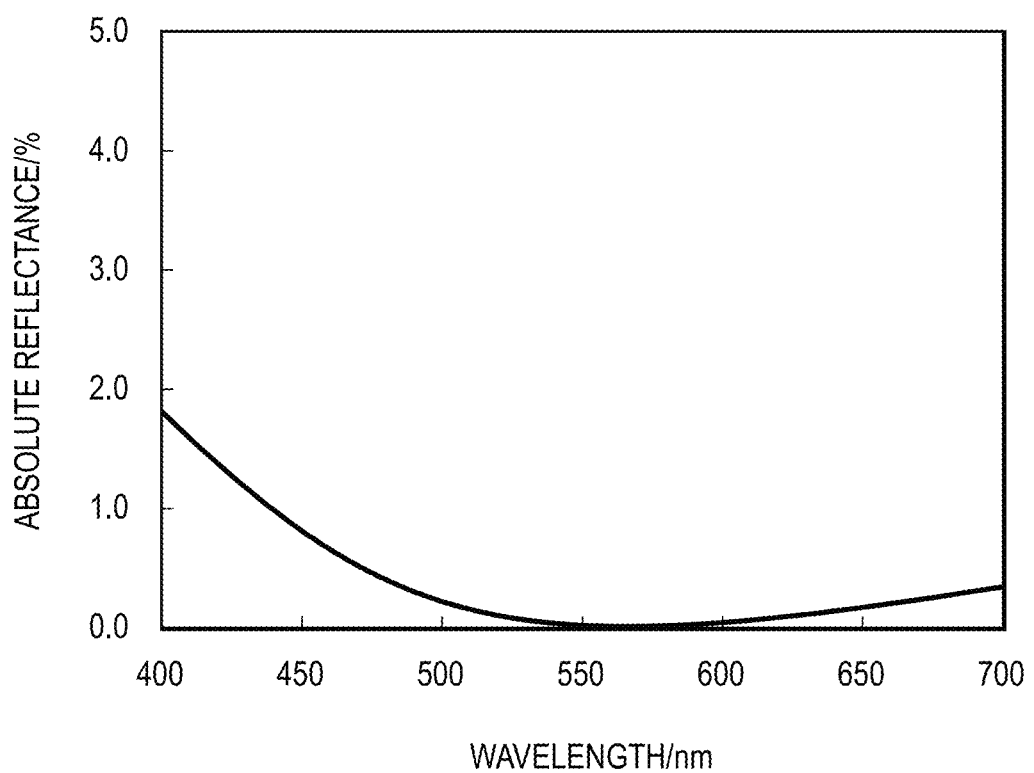
FIG. 9 is a graph showing absolute reflectance of a transparent member in Example 7.

The obtained porous layer had an average reflectance of 0.18% (FIG. 9). In the anti-fogging property evaluation, no fogging was observed even after 600 seconds, and the average reflectance after the anti-fogging property evaluation was 0.18%, which was the same as before the evaluation.

Example 8

In Example 8, on a disk-shaped polycarbonate substrate (nd=1.58) having a diameter (φ) of 60 mm and a thickness of 4 mm, an appropriate amount of the polyacrylic acid solution 9 was dropped, then was subjected to spin coating at 3,000 rpm for 30 seconds, and was subjected to thermal curing at 120° C. for 40 minutes in a hot air circulating oven, giving an organic layer having a film thickness of 1,070 nm. On the organic layer, an appropriate amount of the silicon oxide particle dispersion liquid 1 was dropped, then was subjected to spin coating at 4,000 rpm for 20 seconds, and was heated at 120° C. for 40 minutes in a hot air circulating oven, giving a chained silicon oxide particle porous layer having a film thickness of 123 nm on the organic layer.

Figure 10:
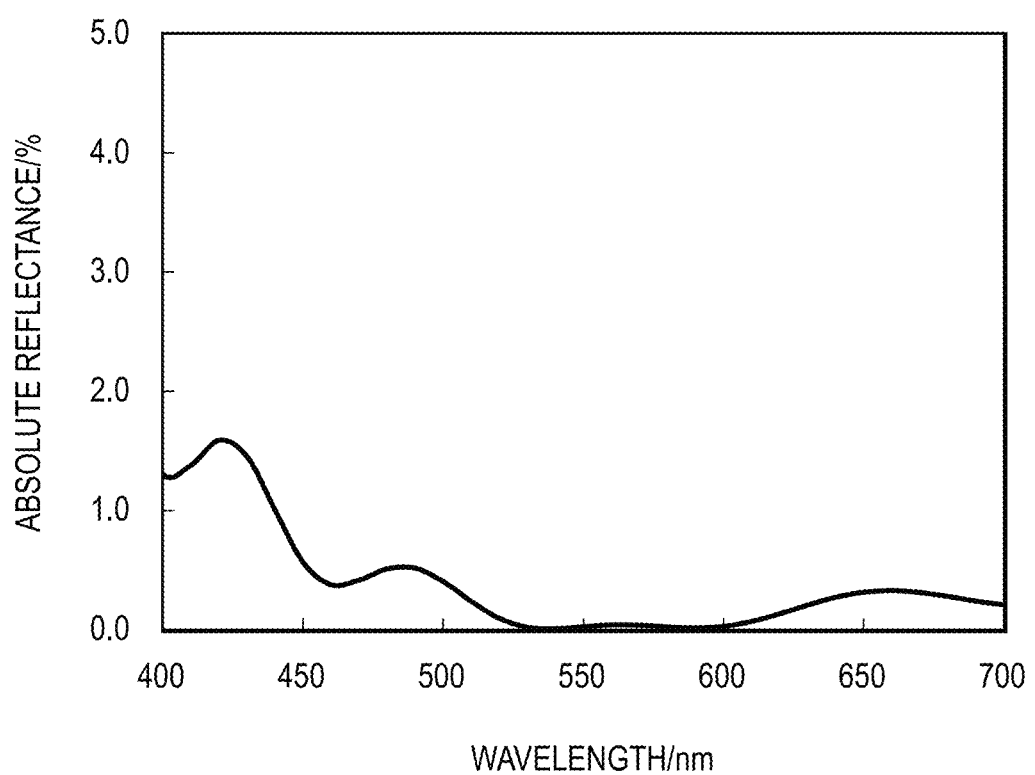
FIG. 10 is a graph showing absolute reflectance of a transparent member in Example 8.
Figure 11:
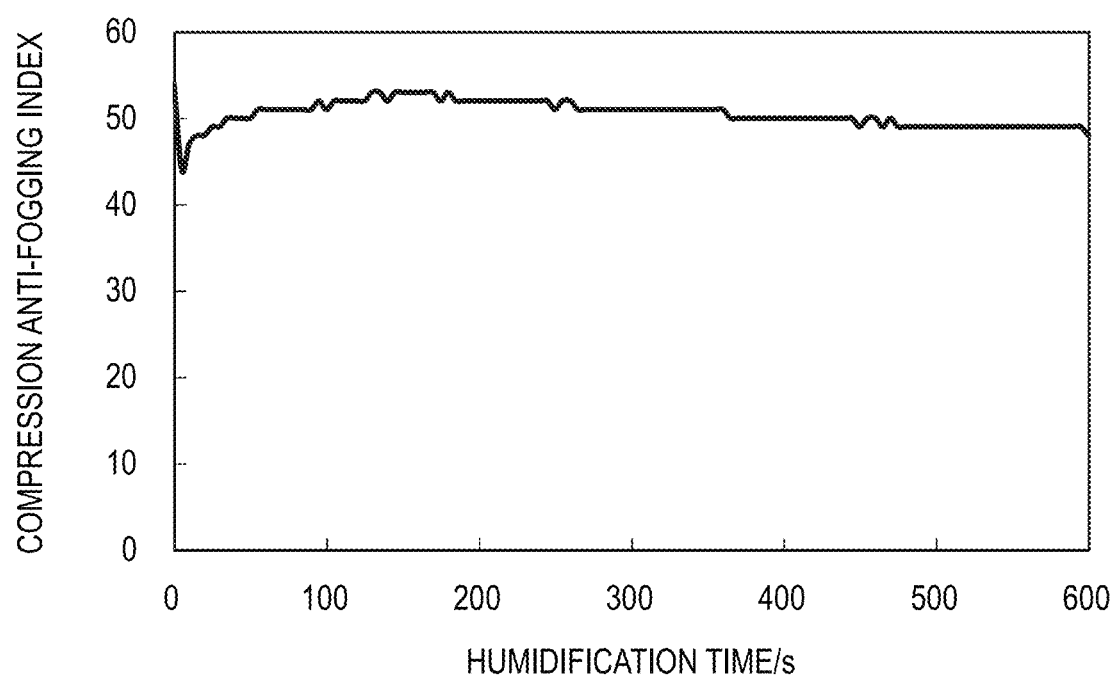
FIG. 11 is a graph showing changes in compression anti-fogging index with humidification time of the transparent member in Example 8.

The obtained porous layer had a refractive index of 1.236, an average reflectance of 0.20% (FIG. 10), and a contact angle of pure water of 10°. The porosity determined from the refractive index was 49%. In the anti-fogging property evaluation, no fogging was observed even after 600 seconds (FIG. 11), and the average reflectance after the anti-fogging property evaluation was 0.21%, which was substantially the same as before the evaluation.

Example 9

In Example 9, on a disk-shaped glass substrate (nd=1.52) having a diameter (φ) of 70 mm and a thickness of 3 mm, an appropriate amount of the polyacrylic acid solution 11 was dropped, then was subjected to spin coating at 3,000 rpm for 30 seconds, and was subjected to thermal curing at 140° C. for 30 minutes in a hot air circulating oven, giving an organic layer having a film thickness of 1,020 nm. Subsequently, the same procedure as in Example 1 was performed to form a chained silicon oxide particle porous layer on the organic layer.

The obtained porous layer had an average reflectance of 0.19%. In the anti-fogging property evaluation, no fogging was observed even after 600 seconds, and the average reflectance after the anti-fogging property evaluation was 0.18%, which was substantially the same as before the evaluation.

Example 10

In Example 10, on a disk-shaped glass substrate (nd=1.52) having a diameter (φ) of 70 mm and a thickness of 3 mm, an appropriate amount of the polyacrylic acid solution 5 was dropped, then was subjected to spin coating at 3,000 rpm for 30 seconds, and was subjected to thermal curing at 140° C. for 30 minutes in a hot air circulating oven, giving an organic layer having a film thickness of 980 nm. On the organic layer, an appropriate amount of the silicon oxide particle dispersion liquid 2 was dropped, then was subjected to spin coating at 4,500 rpm for 20 seconds, and was heated at 140° C. for 30 minutes in a hot air circulating oven, giving a spherical silicon oxide particle porous layer having a film thickness of 105 nm on the organic layer.

The obtained porous layer had a refractive index of 1.313, an average reflectance of 0.52%, and a contact angle of pure water of 7°. The porosity determined from the refractive index was 32%. In the anti-fogging property evaluation, no fogging was observed even after 600 seconds, and the average reflectance after the anti-fogging property evaluation was 0.52%, which was the same as before the evaluation.

Example 11

In Example 11, on a disk-shaped glass substrate (nd=1.52) having a diameter (φ) of 70 mm and a thickness of 3 mm, an appropriate amount of the polyacrylic acid solution 7 was dropped, then was subjected to spin coating at 3,000 rpm for 30 seconds, and was subjected to thermal curing at 140° C. for 30 minutes in a hot air circulating oven, giving an organic layer having a film thickness of 220 nm. Subsequently, the same procedure as in Example 10 was performed to form a spherical silicon oxide particle porous layer on the organic layer.

Figure 12:
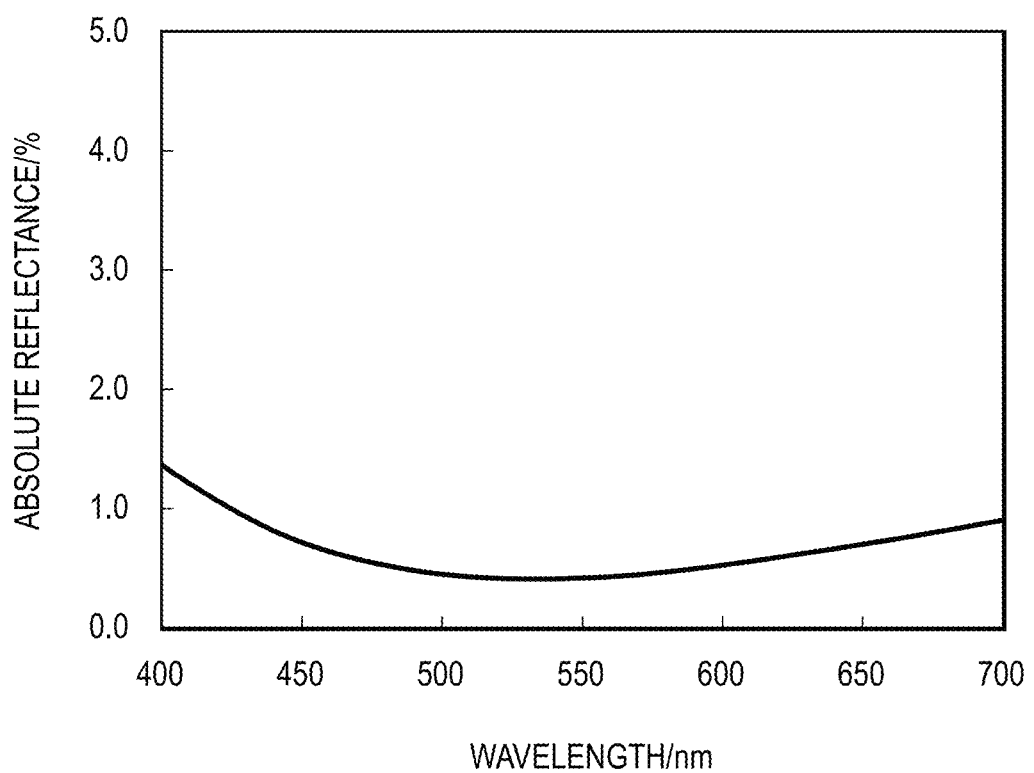
FIG. 12 is a graph showing absolute reflectance of a transparent member in Example 11.
Figure 13:
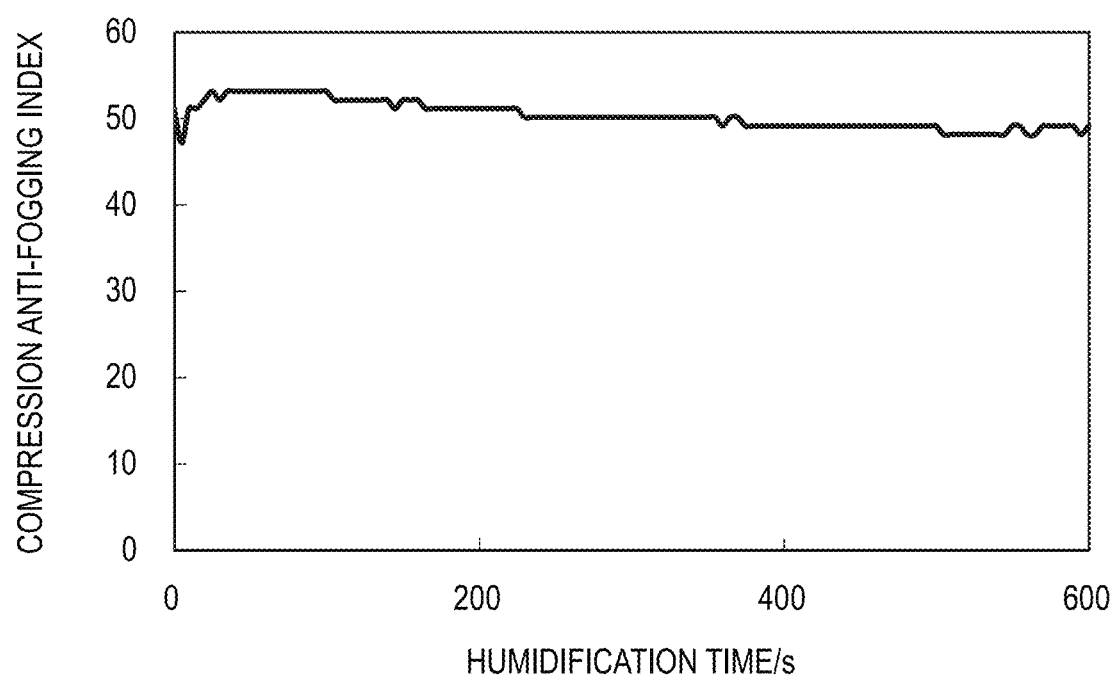
FIG. 13 is a graph showing changes in compression anti-fogging index with humidification time of the transparent member in Example 11.

The obtained porous layer had an average reflectance of 0.51% (FIG. 12). In the anti-fogging property evaluation, no fogging was observed even after 600 seconds (FIG. 13), and the average reflectance after the anti-fogging property evaluation was 0.51%, which was the same as before the evaluation.

Example 12

In Example 12, on a disk-shaped glass substrate (nd=1.52) having a diameter (φ) of 70 mm and a thickness of 3 mm, an appropriate amount of the polyacrylic acid solution 9 was dropped, then was subjected to spin coating at 3,000 rpm for 30 seconds, and was subjected to thermal curing at 140° C. for 30 minutes in a hot air circulating oven, giving an organic layer having a film thickness of 1,040 nm. Subsequently, the same procedure as in Example 10 was performed to form a spherical silicon oxide particle porous layer on the organic layer.

Figure 14:
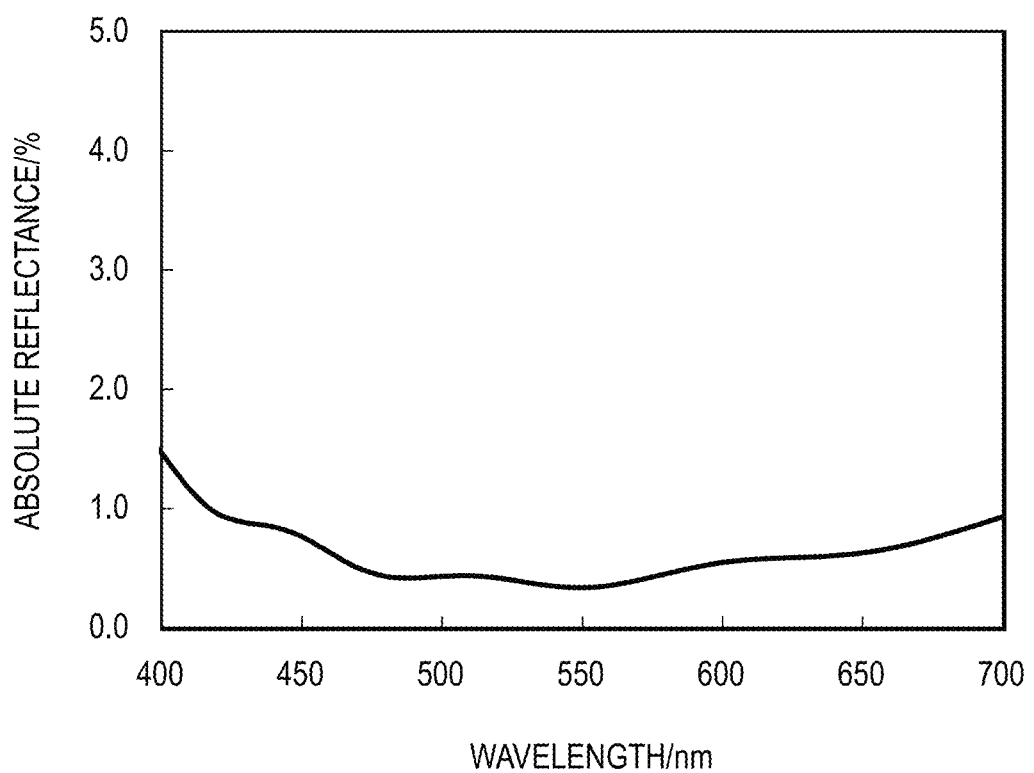
FIG. 14 is a graph showing absolute reflectance of a transparent member in Example 12.

The obtained porous layer had an average reflectance of 0.48% (FIG. 14). In the anti-fogging property evaluation, no fogging was observed even after 600 seconds, and the average reflectance after the anti-fogging property evaluation was 0.49%, which was substantially the same as before the evaluation.

Example 13

In Example 13, on a disk-shaped polycarbonate substrate (nd=1.58) having a diameter (φ) of 60 mm and a thickness of 4 mm, an appropriate amount of the polyacrylic acid solution 9 was dropped, then was subjected to spin coating at 3,000 rpm for 30 seconds, and was subjected to thermal curing at 140° C. for 30 minutes in a hot air circulating oven, giving an organic layer having a film thickness of 1,080 nm. On the organic layer, an appropriate amount of the silicon oxide particle dispersion liquid 2 was dropped, then was subjected to spin coating at 4,500 rpm for 20 seconds, and was heated at 120° C. for 40 minutes in a hot air circulating oven, giving a spherical silicon oxide particle porous layer having a film thickness of 108 nm on the organic layer.

Figure 15:
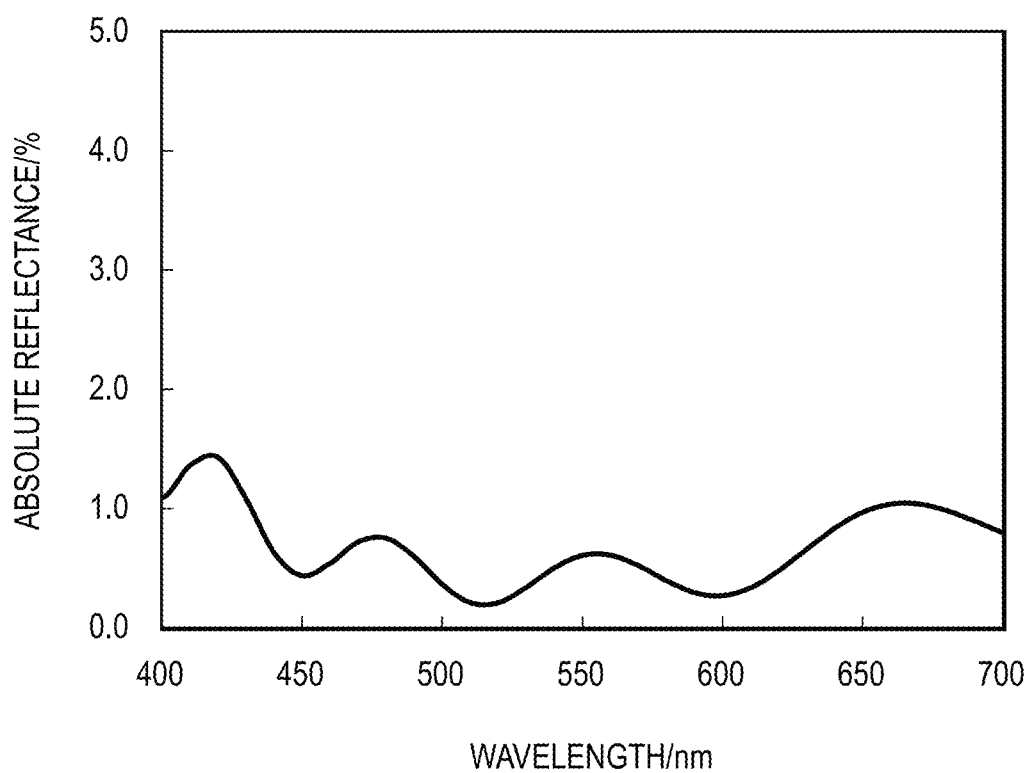
FIG. 15 is a graph showing absolute reflectance of a transparent member in Example 13.
Figure 16:
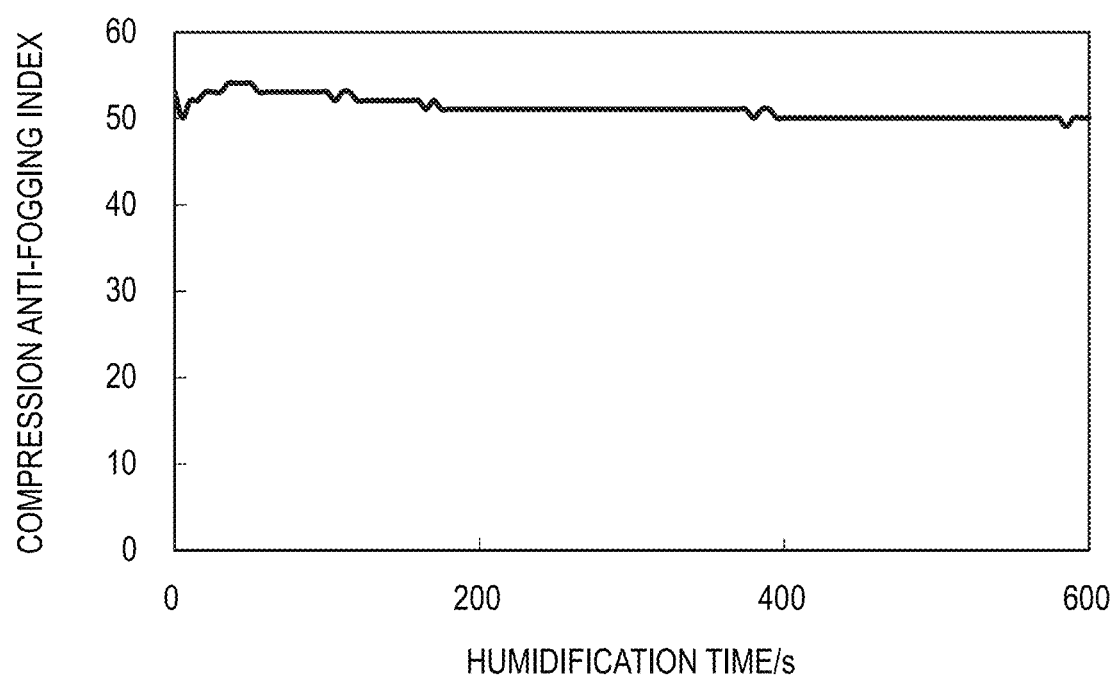
FIG. 16 is a graph showing changes in compression anti-fogging index with humidification time of the transparent member in Example 13.

The obtained porous layer had a refractive index of 1.314, an average reflectance of 0.50% (FIG. 15), and a contact angle of pure water of 8°. The porosity determined from the refractive index was 32%. In the anti-fogging property evaluation, no fogging was observed even after 600 seconds (FIG. 16), and the average reflectance after the anti-fogging property evaluation was 0.51%, which was substantially the same as before the evaluation.

Example 14

In Example 14, on a disk-shaped glass substrate (nd=1.52) having a diameter (φ) of 70 mm and a thickness of 3 mm, an appropriate amount of the polyacrylic acid solution 11 was dropped, then was subjected to spin coating at 3,000 rpm for 30 seconds, and was subjected to thermal curing at 140° C. for 30 minutes in a hot air circulating oven, giving an organic layer having a film thickness of 1,000 nm. Subsequently, the same procedure as in Example 10 was performed to form a spherical silicon oxide particle porous layer on the organic layer.

The obtained porous layer had an average reflectance of 0.51%. In the anti-fogging property evaluation, no fogging was observed even after 600 seconds, and the average reflectance after the anti-fogging property evaluation was 0.51%, which was the same as before the evaluation.

Example 15

In Example 15, on a disk-shaped glass substrate (nd=1.52) having a diameter (φ) of 70 mm and a thickness of 3 mm, an appropriate amount of the polyacrylic acid solution 5 was dropped, then was subjected to spin coating at 1,200 rpm for 30 seconds, and was subjected to thermal curing at 140° C. for 30 minutes in a hot air circulating oven, giving an organic layer having a film thickness of 980 nm. An appropriate amount of a sol liquid prepared by mixing 5.2 g of ethyl silicate, 0.7 g of a block copolymer (Pluronic P123 (trade name), manufactured by BASF), 10 g of ethanol, and 2.7 g of 0.01 mol/L diluted hydrochloric acid was dropped on the organic layer, and was subjected to spin coating at 2,000 rpm for 20 seconds. The coating was heated at 160° C. for 4 hours in a hot air circulating oven and was further treated with an UV cleaning apparatus (manufactured by Eye Graphics Co., Ltd.; OC-2506 (trade name)) for 10 minutes to remove the block copolymer, giving a silicon oxide porous layer having a film thickness of 110 nm on the organic layer.

Figure 17:
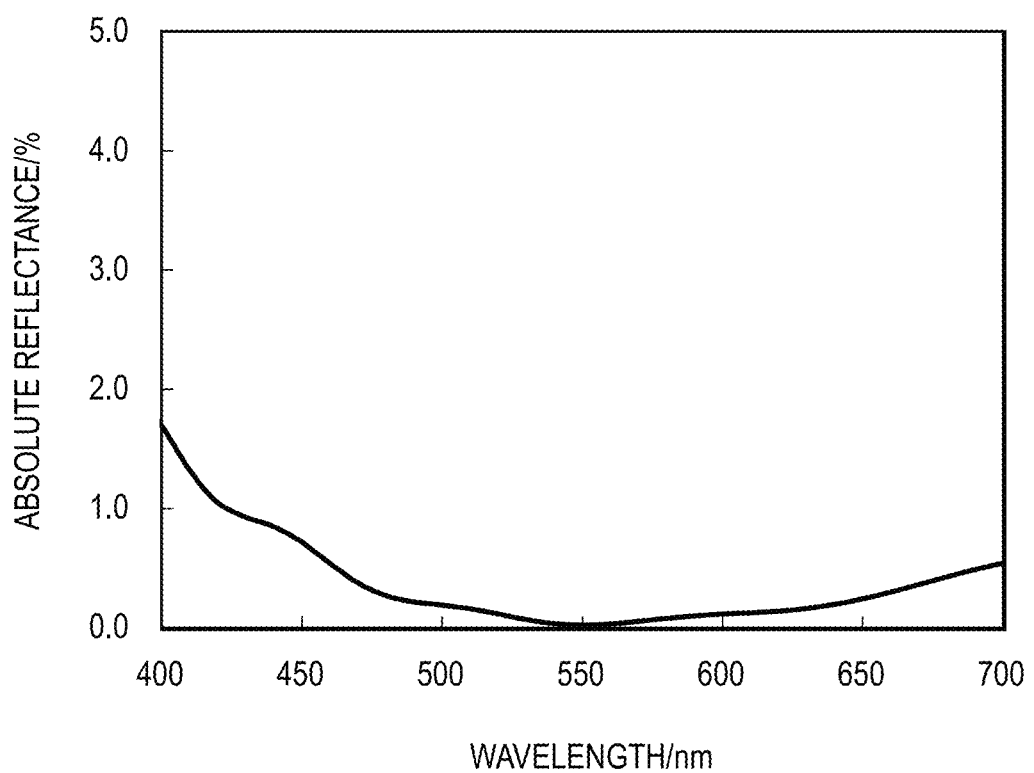
FIG. 17 is a graph showing absolute reflectance of a transparent member in Example 15.

The thus obtained porous layer had a refractive index of 1.265, an average reflectance of 0.20% (FIG. 17), and a contact angle of pure water of 7°. The porosity determined from the refractive index was 42%. In the anti-fogging property evaluation, no fogging was observed even after 600 seconds, and the average reflectance after the anti-fogging property evaluation was 0.22%, which was substantially the same as before the evaluation.

Comparative Example 1

In Comparative Example 1, on a disk-shaped glass substrate (nd=1.52) having a diameter (φ) of 70 mm and a thickness of 3 mm, an appropriate amount of the silicon oxide particle dispersion liquid 1 was dropped, then was subjected to spin coating at 4,000 rpm for 20 seconds, and was heated at 140° C. for 30 minutes in a hot air circulating oven, giving a chained silicon oxide particle porous layer having a film thickness of 122 nm.

Figure 18:
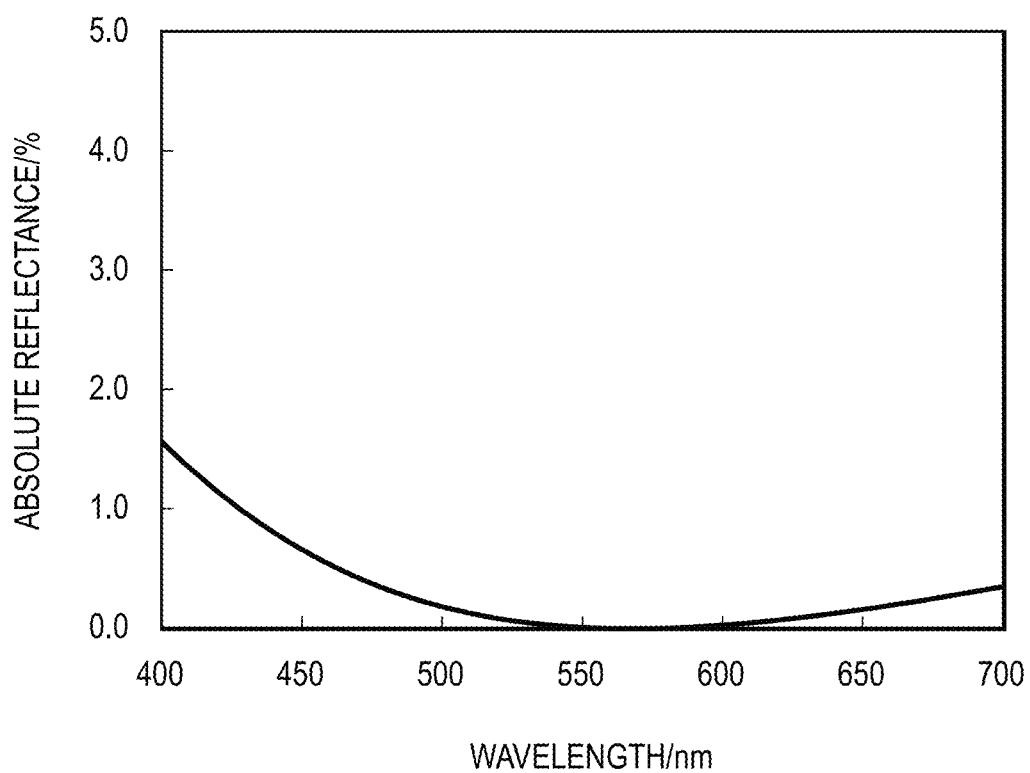
FIG. 18 is a graph showing absolute reflectance of a transparent member in Comparative Example 1.
Figure 19:
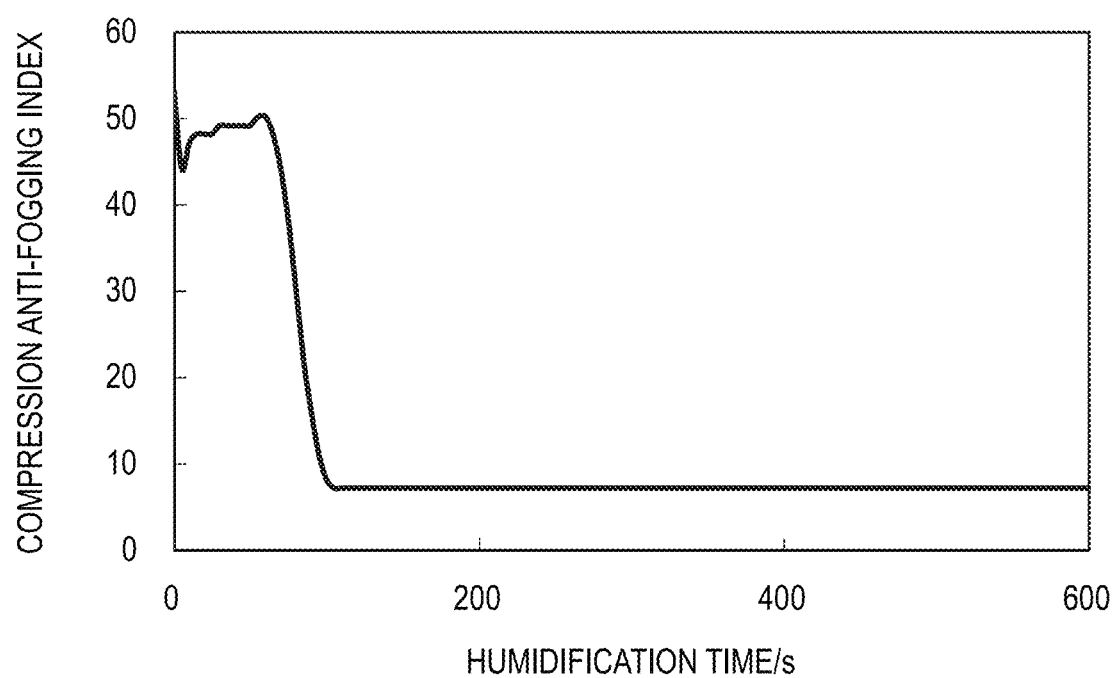
FIG. 19 is a graph showing changes in compression anti-fogging index with humidification time of the transparent member in Comparative Example 1.

The obtained porous layer had a refractive index of 1.234, an average reflectance of 0.16% (FIG. 18), and a contact angle of pure water of 9°. The porosity determined from the refractive index was 49%. In the anti-fogging property evaluation, fogging was started at 75 seconds and was completed at 100 seconds (FIG. 19). The average reflectance after the anti-fogging property evaluation was 0.16%, which was the same as before the evaluation.

Comparative Example 2

In Comparative Example 2, on a disk-shaped glass substrate (nd=1.52) having a diameter (φ) of 70 mm and a thickness of 3 mm, an appropriate amount of the silicon oxide particle dispersion liquid 2 was dropped, then was subjected to spin coating at 4,500 rpm for 20 seconds, and was heated at 140° C. for 30 minutes in a hot air circulating oven, giving a spherical silicon oxide particle porous layer having a film thickness of 107 nm.

Figure 20:
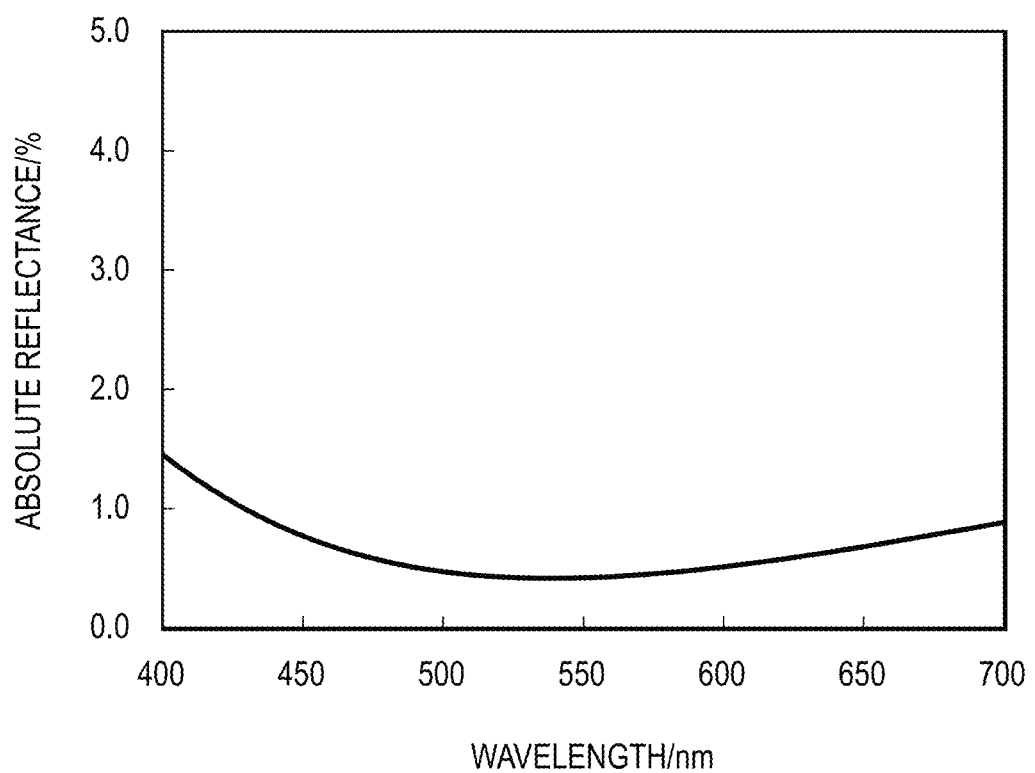
FIG. 20 is a graph showing absolute reflectance of a transparent member in Comparative Example 2.

The obtained porous layer had a refractive index of 1.312, an average reflectance of 0.52% (FIG. 20), and a contact angle of pure water of 7°. The porosity determined from the refractive index was 32%. In the anti-fogging property evaluation, fogging was started at 65 seconds and was completed at 95 seconds. The average reflectance after the anti-fogging property evaluation was 0.52%, which was the same as before the evaluation.

Comparative Example 3

In Comparative Example 3, on a disk-shaped glass substrate (nd=1.52) having a diameter (φ) of 70 mm and a thickness of 3 mm, an appropriate amount of a sol liquid prepared by mixing 5.2 g of ethyl silicate, 0.7 g of a block copolymer (Pluronic P123, manufactured by BASF), 10 g of ethanol, and 2.7 g of 0.01 mol/L diluted hydrochloric acid was dropped, and was subjected to spin coating at 2,000 rpm for 20 seconds. The coating was heated at 160° C. for 4 hours in a hot air circulating oven and was further treated with an UV cleaning apparatus (manufactured by Eye Graphics Co., Ltd.; OC-2506 (trade name)) for 10 minutes to remove the block copolymer, giving a silicon oxide porous layer having a film thickness of 110 nm.

Figure 21:
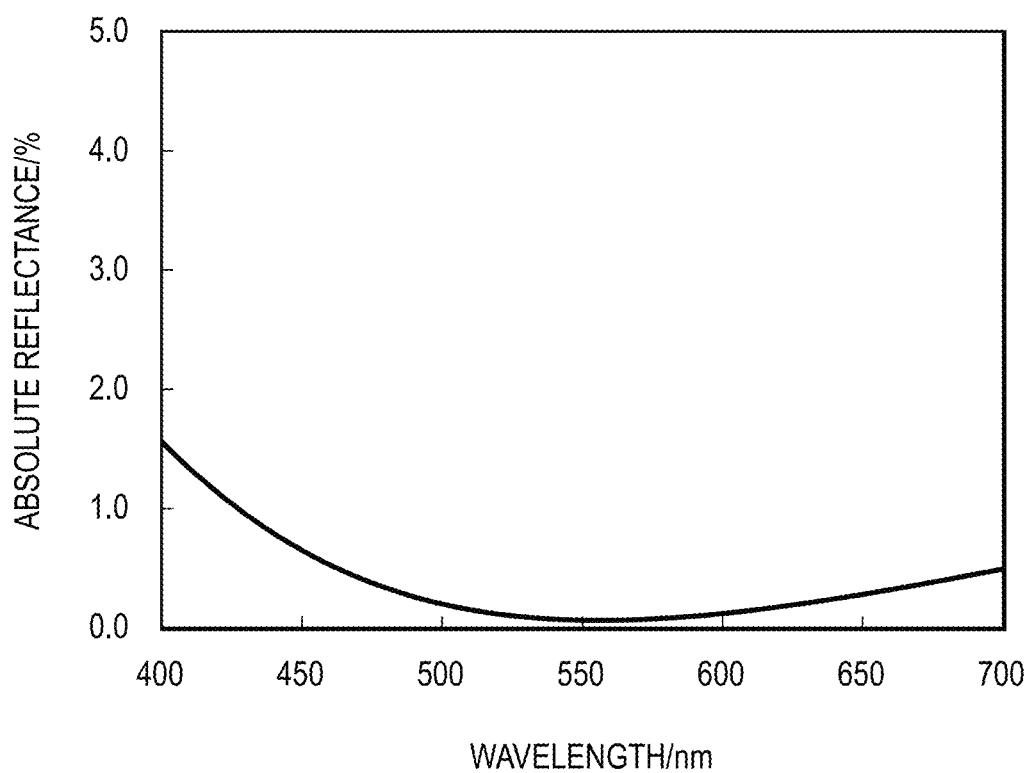
FIG. 21 is a graph showing absolute reflectance of a transparent member in Comparative Example 3.

The obtained porous layer had a refractive index of 1.265, an average reflectance of 0.22% (FIG. 21), and a contact angle of pure water of 7°. The porosity determined from the refractive index was 42%. In the anti-fogging property evaluation, fogging was started at 70 seconds and was completed at 100 seconds. The average reflectance after the anti-fogging property evaluation was 0.24%, which was substantially the same as before the evaluation.

Comparative Example 4

In Comparative Example 4, on a disk-shaped glass substrate (nd=1.52) having a diameter (φ) of 70 mm and a thickness of 3 mm, an appropriate amount of the polyacrylic acid solution 4 was dropped, then was subjected to spin coating at 1,200 rpm for 30 seconds, and was subjected to thermal curing at 140° C. for 30 minutes in a hot air circulating oven, giving an organic layer having a film thickness of 3,080 nm. No porous layer was formed.

Figure 22:
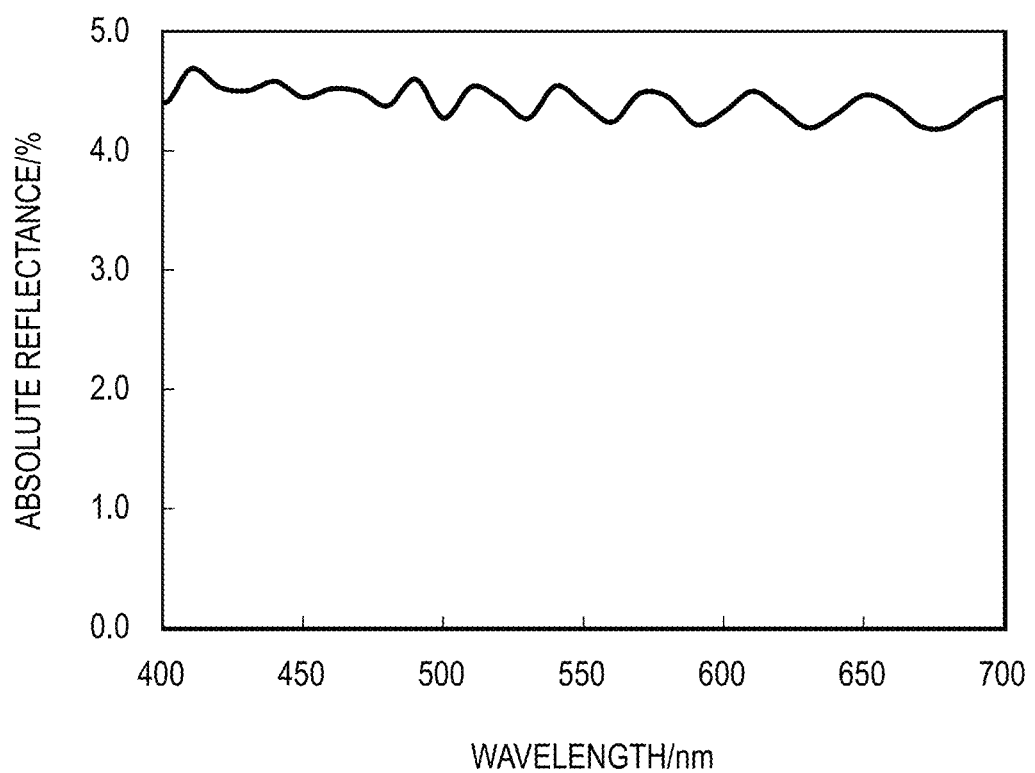
FIG. 22 is a graph showing absolute reflectance of a transparent member in Comparative Example 4.
Figure 23:
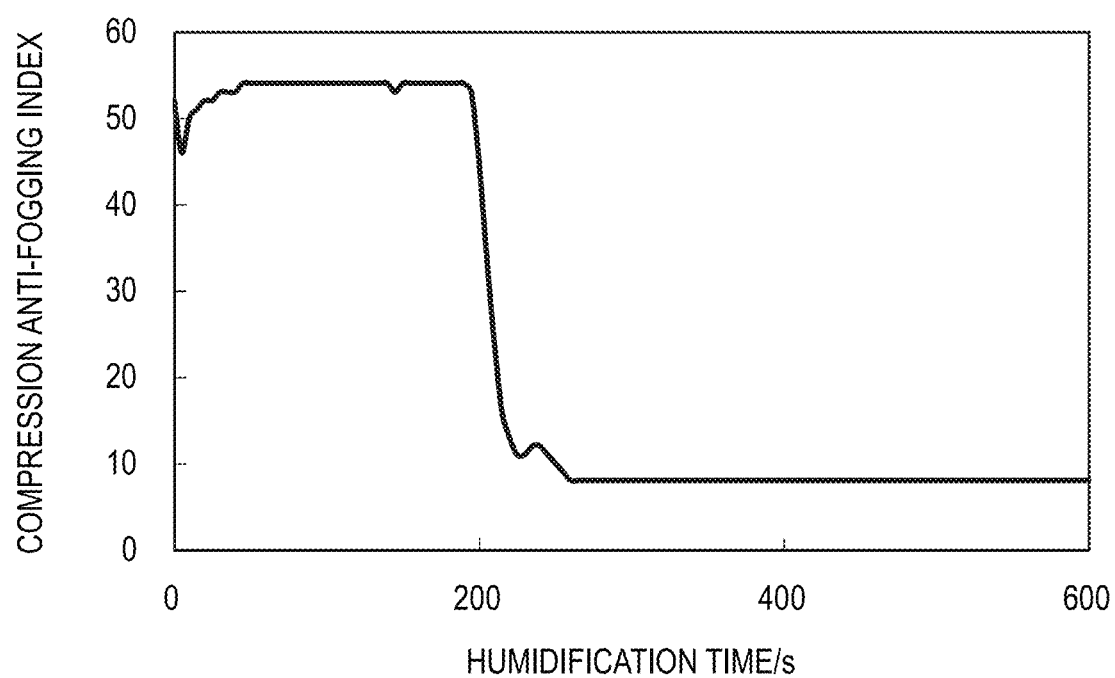
FIG. 23 is a graph showing changes in compression anti-fogging index with humidification time of the transparent member in Comparative Example 4.

The formed organic layer had an average reflectance of 4.40% (FIG. 22) and a contact angle of pure water of 43°. In the anti-fogging property evaluation, fogging was started at 205 seconds and was completed at 230 seconds (FIG. 23). The average reflectance after the anti-fogging property evaluation was 4.70%, and changes probably caused by swelling were observed.

Comparative Example 5

In Comparative Example 5, on a disk-shaped glass substrate (nd=1.52) having a diameter (φ) of 70 mm and a thickness of 3 mm, an appropriate amount of the polyacrylic acid solution 5 was dropped, then was subjected to spin coating at 3,000 rpm for 30 seconds, and was subjected to thermal curing at 140° C. for 30 minutes in a hot air circulating oven, giving an organic layer having a film thickness of 500 nm. No porous layer was formed.

The formed organic layer had an average reflectance of 4.15% and a contact angle of pure water of 41°. In the anti-fogging property evaluation, fogging was started at 90 seconds and was completed at 120 seconds. The average reflectance after the anti-fogging property evaluation was 4.30%, and changes probably caused by swelling were observed.

Comparative Example 6

In Comparative Example 6, on a disk-shaped glass substrate (nd=1.52) having a diameter (φ) of 70 mm and a thickness of 3 mm, an appropriate amount of the polyacrylic acid solution 9 was dropped, then was subjected to spin coating at 3,000 rpm for 30 seconds, and was subjected to thermal curing at 140° C. for 30 minutes in a hot air circulating oven, giving an organic layer having a film thickness of 1,050 nm. No porous layer was formed.

The formed organic layer had an average reflectance of 4.37% and a contact angle of pure water of 37°. In the anti-fogging property evaluation, fogging was started at 125 seconds and was completed at 150 seconds. The average reflectance after the anti-fogging property evaluation was 4.50%, and changes probably caused by swelling were observed.

Comparative Example 7

In Comparative Example 7, on a disk-shaped glass substrate (nd=1.52) having a diameter (φ) of 70 mm and a thickness of 3 mm, an appropriate amount of a liquid prepared by diluting the polyacrylic acid solution 3 with a mixed solvent of PGME and pure water (mass ratio: PGME/pure water=7/3) twice was dropped, then was subjected to spin coating at 3,000 rpm for 30 seconds, and was subjected to thermal curing at 140° C. for 30 minutes in a hot air circulating oven, giving an organic layer having a film thickness of 3,150 nm and including no organic crosslinking chains. Subsequently, the same procedure as in Example 1 was performed to form a chained silicon oxide particle porous layer on the organic layer.

The obtained porous layer had an average reflectance of 0.28%, but uneven reflected light was observed. In the anti-fogging property evaluation, fogging was started at 230 seconds, and the compression anti-fogging index reached 0 at 260 seconds to indicate complete fogging. The average reflectance after the anti-fogging property evaluation is markedly degraded to 1.20%.

Evaluation of Examples and Comparative Examples

Each transparent member including only the silicon oxide porous layer in Comparative Examples 1 to 3 had a low reflectance, which was slightly changed after the anti-fogging property evaluation, but the time to start fogging in the anti-fogging property evaluation was much less than 100 seconds. In Comparative Examples 4 to 6 in which only the organic layer was provided as the cured film of a polymer having an acidic group and a crosslinking agent, the time to start fogging was prolonged to about 200 seconds depending on film thicknesses thereof, but the reflectance was high due to moisture absorption. In Comparative Example 7 in which a silicon oxide porous layer was formed on a polymer film having an acidic group but having no organic crosslinking chain, the time to start fogging was prolonged to more than 200 seconds, but the reflectance was markedly reduced probably due to diffusion of the polymer in the porous layer during the anti-fogging test. In each Comparative Example, the compression anti-fogging index was 0 after 200 seconds, and complete fogging was observed.

In contrast, in Examples 1 to 15, each transparent member did not start to cause fogging in the anti-fogging property evaluation even after 600 seconds regardless of film thickness and the like. In addition, it was shown that the reflectance was low and the low reflectance was maintained after the anti-fogging property evaluation.

As a result, the transparent members in Examples were revealed to have excellent anti-fogging properties, anti-reflective function, and durability as compared with the transparent members in Comparative Examples.

The transparent member of the present invention can be used as it is for common applications including windowpanes, mirrors, lenses, and transparent films, as well for optical members including optical lenses for imaging and projection, optical mirrors, optical filters, eyepieces, and flat covers and dome covers for outdoor cameras and monitoring cameras.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-243145, filed Dec. 19, 2017, and Japanese Patent Application No. 2018-222755, filed Nov. 28, 2018, which are hereby incorporated by reference herein in their entirety.

What is claimed is:
1. A member comprising:
a substrate; and
a stacked body having an organic layer and an inorganic porous layer stacked on the substrate in stated order from a substrate side such that the organic layer and the inorganic porous layer are in contact with each other,
wherein the organic layer is a cured product of an organic polymer having an acidic group and at least one crosslinking agent selected from the group consisting of 1,3-bis(hydroxymethyl)urea, 1,3-bis(hydroxymethyl)-5-[1,3-bis(hydroxymethyl)ureido]hydantoin, 1,3,4,6-tetrakis(methoxymethyl)glycoluril, 1,3-bis(methoxymethyl)-4,5-dimethoxy-2-imidazolidinone, 1,3-bis(methoxymethyl)urea, 2,6-dihydroxymethyl-4-methylphenol, 2,4-dihydroxymethyl-6-methylphenol, and 2,2-bis(4-hydroxy-3,5-dihydroxymethylphenyl)propane,
wherein the organic layer comprises an organic molecular chain network consisting of organic polymer chains and organic crosslinking chains, and an aggregate of the acidic group,
wherein the inorganic porous layer has hydrophilicity, includes a plurality of spherical silica particles having an average particle diameter of 5 nm to 100 nm, or a plurality of chain silica particles having an average minor axis length of 5 nm to 40 nm and a major axis length to minor axis length ratio of 3 to 12, and has an average pore diameter of 3 nm to 30 nm, and
wherein an element ratio C/Si in the inorganic porous layer is not more than 3/100.
2. The member according to claim 1, wherein an organic crosslinking chain has 3 to 30 carbon atoms.
3. The member according to claim 1, wherein the acidic group is a carboxyl group or a thiocarboxyl group.
4. The member according to claim 3, wherein the acidic group has a pKa of 5 or less.
5. The member according to claim 1, wherein the at least one crosslinking agent has a cationic curable organic group.
6. The member according to claim 1, wherein the organic layer has a thickness of 100 nm to 5,000 nm.
7. The member according to claim 1, wherein the inorganic porous layer contains 80% by weight or more of silicon oxide particles.
8. The member according to claim 1, wherein the inorganic porous layer has a thickness of 70 nm to 150 nm.

9. The member according to claim 1, wherein the inorganic porous layer has a porosity of 10% by volume to 70% by volume.

10. The member according to claim 1, wherein a surface of the inorganic porous layer has a contact angle with pure water of 3° to 30°.

11. An imaging apparatus comprising:
a housing;
an optical system disposed inside the housing;
an image sensor configured to convert an image incident through the optical system into a signal; and
a transparent member provided at a boundary between an outside and an inside of the housing,
wherein the transparent member comprises a substrate and a stacked body having an organic layer and an inorganic porous layer stacked on a surface of the substrate facing inside the housing in stated order from a substrate side such that the organic layer and the inorganic porous layer are in contact with each other,
wherein the organic layer is a cured product of an organic polymer having an acidic group and at least one crosslinking agent selected from the group consisting of 1,3-bis(hydroxymethyl)urea, 1,3-bis(hydroxymethyl)-5-[1,3-bis(hydroxymethyl)ureido]hydantoin, 1,3,4,6-tetrakis(methoxymethyl)glycoluril, 1,3-bis(methoxymethyl)-4,5-dimethoxy-2-imidazolidinone, 1,3-bis(methoxymethyl)urea, 2,6-dihydroxymethyl-4-methylphenol, 2,4-dihydroxymethyl-6-methylphenol, and 2,2-bis(4-hydroxy-3,5-dihydroxymethylphenyl)propane,
wherein the organic layer comprises an organic molecular chain network consisting of organic polymer chains and organic crosslinking chains, and an aggregate of the acidic group,
wherein the inorganic porous layer has hydrophilicity, includes a plurality of spherical silica particles having an average particle diameter of 5 nm to 100 nm, or a plurality of chain silica particles having an average minor axis length of 5 nm to 40 nm and a major axis length to minor axis length ratio of 3 to 12, and has an average pore diameter of 3 nm to 30 nm, and
wherein an element ratio C/Si in the inorganic porous layer is not more than 3/100.

12. A cover member comprising the member according to claim 1, wherein the substrate has a transmittance of over 50% for visible light.

13. A lens for an optical system comprising the member according to claim 1, wherein the substrate has a transmittance of over 50% for visible light.

14. The imaging apparatus according to claim 11, wherein the organic layer contains, as the organic polymer having the acidic group, at least one organic polymer selected from the group consisting of polymers having a phenolic hydroxy group, or copolymers thereof; polymers having a carboxyl group or a thiocarboxyl group, or copolymers thereof; polymers having a sulfonamide group, or copolymers thereof; and polymers having a sulfonic acid group, or copolymers thereof.

15. The member according to claim 1, wherein the organic layer contains, as the organic polymer having the acidic group, at least one organic polymer selected from the group consisting of polymers having a phenolic hydroxy group, or copolymers thereof; polymers having a carboxyl group or a thiocarboxyl group, or copolymers thereof; polymers having a sulfonamide group, or copolymers thereof; and polymers having a sulfonic acid group, or copolymers thereof.

16. A method for producing a member having a stacked body provided on a substrate, the method comprising:
a step of forming, on a substrate, an organic layer by application of a solution and thermal curing,
wherein the solution comprises an organic polymer having an acidic group and at least one crosslinking agent selected from the group consisting of 1,3-bis(hydroxymethyl)urea, 1,3-bis(hydroxymethyl)-5-[1,3-bis(hydroxymethyl)ureido]hydantoin, 1,3,4,6-tetrakis(methoxymethyl)glycoluril, 1,3-bis(methoxymethyl)-4,5-dimethoxy-2-imidazolidinone, 1,3-bis(methoxymethyl)urea, 2,6-dihydroxymethyl-4-methylphenol, 2,4-dihydroxymethyl-6-methylphenol, and 2,2-bis(4-hydroxy-3,5-dihydroxymethylphenyl)propane; and
a step of forming, on the organic layer, a hydrophilic inorganic porous layer on the organic layer by application of a lquid,
wherein the liquid used for forming the hydrophilic inorganic porous layer comprises a plurality of spherical silica particles having an average particle diameter of 5 nm to 100 nm, or a plurality of chain silica particles having an average minor axis length of 5 nm to 40 nm and a major axis length to minor axis length ratio of 3 to 12, and a silicon oxide condensate, and
wherein a weight-average molecular weight of the silicon oxide condensate is 500 to 3000 on the basis of polystyrene.

17. The method according to claim 16, wherein the solution contains, as the organic polymer having the acidic group, at least one organic polymer selected from the group consisting of polymers having a phenolic hydroxy group, or copolymers thereof; polymers having a carboxyl group or a thiocarboxyl group, or copolymers thereof; polymers having a sulfonamide group, or copolymers thereof; and polymers having a sulfonic acid group, or copolymers thereof.

* * * * *